United States Patent
Clifton et al.

(10) Patent No.: US 11,843,040 B2
(45) Date of Patent: Dec. 12, 2023

(54) MIS CONTACT STRUCTURE WITH METAL OXIDE CONDUCTOR

(71) Applicant: Acorn Semi, LLC, Palo Alto, CA (US)

(72) Inventors: Paul A. Clifton, Redwood City, CA (US); Andreas Goebel, Mountain View, CA (US)

(73) Assignee: Acorn Semi, LLC, Palo Alto, CA (US)

( * ) Notice: Subject to any disclaimer, the term of this patent is extended or adjusted under 35 U.S.C. 154(b) by 77 days.

(21) Appl. No.: 17/094,651

(22) Filed: Nov. 10, 2020

(65) Prior Publication Data

US 2021/0126981 A1 Apr. 29, 2021
US 2023/0317814 A9 Oct. 5, 2023

Related U.S. Application Data

(63) Continuation of application No. 16/742,098, filed on Jan. 14, 2020, which is a continuation of application
(Continued)

(51) Int. Cl.
*H01L 29/49* (2006.01)
*H01L 29/08* (2006.01)
(Continued)

(52) U.S. Cl.
CPC .... *H01L 29/4966* (2013.01); *H01L 21/28017* (2013.01); *H01L 29/0895* (2013.01);
(Continued)

(58) Field of Classification Search
CPC ... H01L 29/4966; H01L 29/36; H01L 29/517; H01L 21/28017
See application file for complete search history.

(56) References Cited

U.S. PATENT DOCUMENTS 2,981,877 A 4/1961 Noyce
3,513,366 A 5/1970 Clark
(Continued)

FOREIGN PATENT DOCUMENTS

EP 0 042 066 A2 12/1981
EP 0 068 897 A2 1/1983
(Continued)

OTHER PUBLICATIONS

*Acorn Semi, LLC v. Samsung Electronics Co., Ltd., et al.,* Case No. 2:19-cv-347-JRG (EDTX), Joint Claim Construction and Prehearing Statement, 10 pgs. (Jul. 23, 2020).
(Continued)

*Primary Examiner* — Kyoung Lee
(74) *Attorney, Agent, or Firm* — ASCENDA LAW GROUP, PC

(57) ABSTRACT

An electrical contact structure (an MIS contact) includes one or more conductors (M-Layer), a semiconductor (S-Layer), and an interfacial dielectric layer (I-Layer) of less than 4 nm thickness disposed between and in contact with both the M-Layer and the S-Layer. The I-Layer is an oxide of a metal or a semiconductor. The conductor of the M-Layer that is adjacent to and in direct contact with the I-Layer is a metal oxide that is electrically conductive, chemically stable and unreactive at its interface with the I-Layer at temperatures up to 450° C. The electrical contact structure has a specific contact resistivity of less than or equal to approximately $10^{-5}$-$10^{-7}$ $\Omega$-cm$^2$ when the doping in the semiconductor adjacent the MIS contact is greater than approximately $2\times10^{19}$ cm$^{-3}$ and less than approximately $10^{-8}$ $\Omega$-cm$^2$ when the doping in the semiconductor adjacent the MIS contact is greater than approximately $10^{20}$ cm$^{-3}$.

18 Claims, 3 Drawing Sheets

Related U.S. Application Data

No. 16/175,637, filed on Oct. 30, 2018, now Pat. No. 10,553,695, which is a continuation of application No. 15/451,164, filed on Mar. 6, 2017, now Pat. No. 10,147,798, which is a continuation of application No. 15/186,378, filed on Jun. 17, 2016, now Pat. No. 9,620,611.

(51) Int. Cl.
  *H01L 29/36* (2006.01)
  *H01L 29/51* (2006.01)
  *H01L 29/66* (2006.01)
  *H04L 67/10* (2022.01)
  *H04L 67/51* (2022.01)
  *H01L 21/28* (2006.01)

(52) U.S. Cl.
  CPC ............ *H01L 29/36* (2013.01); *H01L 29/517* (2013.01); *H01L 29/66643* (2013.01); *H04L 67/10* (2013.01); *H04L 67/51* (2022.05)

(56) References Cited

U.S. PATENT DOCUMENTS

| | | |
|---|---|---|
| 3,590,471 A | 7/1971 | Lepselter et al. |
| 3,614,548 A | 10/1971 | Inoue |
| 3,623,925 A | 11/1971 | Jenkins et al. |
| 3,708,360 A | 1/1973 | Wakefield, Jr. et al. |
| 3,719,797 A | 3/1973 | Andrews, Jr. et al. |
| 3,877,054 A | 4/1975 | Boulin et al. |
| 3,983,264 A | 9/1976 | Schroen et al. |
| 3,983,574 A | 9/1976 | Statz et al. |
| 4,019,113 A | 4/1977 | Hartman |
| 4,056,642 A | 11/1977 | Saxena et al. |
| 4,110,488 A | 8/1978 | Risko |
| 4,278,830 A | 7/1981 | Stirn et al. |
| 4,300,152 A | 11/1981 | Lepselter |
| 4,304,042 A | 12/1981 | Yeh |
| 4,338,616 A | 7/1982 | Bol |
| 4,356,622 A | 11/1982 | Widmann |
| 4,422,090 A | 12/1983 | Shepherd et al. |
| 4,485,265 A | 11/1984 | Gordon et al. |
| 4,485,550 A | 12/1984 | Koeneke et al. |
| 4,538,342 A | 9/1985 | Camlibel et al. |
| 4,566,021 A | 1/1986 | Yokoyama |
| 4,583,110 A | 4/1986 | Jackson et al. |
| 4,689,869 A | 9/1987 | Jambotkar et al. |
| 4,691,219 A | 9/1987 | Goth |
| 4,696,828 A | 9/1987 | Schachter et al. |
| 4,698,652 A | 10/1987 | Umemoto et al. |
| 4,723,197 A | 2/1988 | Takiar et al. |
| 4,752,815 A | 6/1988 | Tsao |
| 4,763,176 A | 8/1988 | Ito |
| 4,772,934 A | 9/1988 | Cunningham et al. |
| 4,794,444 A | 12/1988 | Liu et al. |
| 4,796,082 A | 1/1989 | Murakami et al. |
| 4,800,415 A | 1/1989 | Simmons et al. |
| 4,801,984 A | 1/1989 | Woodall |
| 4,811,077 A | 3/1989 | Fowler et al. |
| 4,835,580 A | 5/1989 | Havemann et al. |
| 4,843,029 A | 6/1989 | Joyce et al. |
| 4,845,050 A | 7/1989 | Kim et al. |
| 4,960,732 A | 10/1990 | Dixit et al. |
| 4,961,194 A | 10/1990 | Kuroda et al. |
| 4,999,685 A | 3/1991 | Waldrop et al. |
| 5,013,685 A | 5/1991 | Chiu et al. |
| 5,019,530 A | 5/1991 | Kleinsasser et al. |
| 5,021,365 A | 6/1991 | Krichner et al. |
| 5,021,840 A | 6/1991 | Morris |
| 5,027,166 A | 6/1991 | Ohtsuka et al. |
| 5,045,502 A | 9/1991 | Lau et al. |
| 5,086,321 A | 2/1992 | Batey et al. |
| 5,093,280 A | 3/1992 | Tully |
| 5,098,859 A | 3/1992 | Jackson et al. |
| 5,191,322 A | 3/1993 | Katayama et al. |
| 5,216,262 A | 6/1993 | Tsu |
| 5,216,271 A | 6/1993 | Takagi et al. |
| 5,216,282 A | 6/1993 | Cote et al. |
| 5,231,306 A | 7/1993 | Meikle et al. |
| 5,238,872 A | 8/1993 | Thalapaneni |
| 5,243,213 A | 9/1993 | Miyazawa et al. |
| 5,292,677 A | 3/1994 | Dennison |
| 5,294,834 A | 3/1994 | Fatemi et al. |
| 5,308,998 A | 5/1994 | Yamazaki et al. |
| 5,355,021 A | 10/1994 | Crouch et al. |
| 5,358,574 A | 10/1994 | Sapori |
| 5,399,206 A | 3/1995 | de Lyon |
| 5,438,210 A | 8/1995 | Worley |
| 5,442,200 A | 8/1995 | Tischler |
| 5,480,829 A | 1/1996 | Abrokwah et al. |
| 5,488,231 A | 1/1996 | Kwon et al. |
| 5,534,449 A | 7/1996 | Dennison et al. |
| 5,563,448 A | 10/1996 | Lee et al. |
| 5,578,848 A | 11/1996 | Kwong et al. |
| 5,592,736 A | 1/1997 | Akram et al. |
| 5,596,218 A | 1/1997 | Soleimani et al. |
| 5,608,266 A | 3/1997 | Agnello et al. |
| 5,612,567 A | 3/1997 | Baliga |
| 5,614,745 A | 3/1997 | Motonami |
| 5,619,057 A | 4/1997 | Komatsu |
| 5,654,234 A | 8/1997 | Shih et al. |
| 5,663,584 A | 9/1997 | Welch |
| 5,677,553 A | 10/1997 | Yamamoto et al. |
| 5,689,125 A | 11/1997 | Vaccaro et al. |
| 5,689,130 A | 11/1997 | Okabe et al. |
| 5,744,817 A | 4/1998 | Shannon |
| 5,789,312 A | 8/1998 | Buchanan et al. |
| 5,793,109 A | 8/1998 | Nakamura |
| 5,793,788 A | 8/1998 | Inaba et al. |
| 5,801,398 A | 9/1998 | Hebiguchi |
| 5,801,444 A | 9/1998 | Aboelfotoh et al. |
| 5,851,912 A | 12/1998 | Li et al. |
| 5,869,364 A | 2/1999 | Nakano et al. |
| 5,876,796 A | 3/1999 | Regolini et al. |
| 5,888,891 A | 3/1999 | Gould |
| 5,897,331 A | 4/1999 | Sopori |
| 5,903,053 A | 5/1999 | Iijima et al. |
| 5,908,313 A | 6/1999 | Chau et al. |
| 5,939,763 A | 8/1999 | Hao et al. |
| 5,943,575 A | 8/1999 | Chung et al. |
| 5,962,883 A | 10/1999 | Hong et al. |
| 5,985,759 A | 11/1999 | Kim et al. |
| 6,004,879 A | 12/1999 | Hu et al. |
| 6,011,271 A | 1/2000 | Sakkuma et al. |
| 6,015,997 A | 1/2000 | Hu et al. |
| 6,017,790 A | 1/2000 | Liou et al. |
| 6,037,605 A | 3/2000 | Yoshimura |
| 6,057,564 A | 5/2000 | Rennie |
| 6,064,082 A | 5/2000 | Kawai et al. |
| 6,071,783 A | 6/2000 | Liang et al. |
| 6,091,076 A | 7/2000 | Deleonibus et al. |
| 6,096,590 A | 8/2000 | Chan et al. |
| 6,117,781 A | 9/2000 | Lukanc et al. |
| 6,130,503 A | 10/2000 | Negishi et al. |
| 6,144,097 A | 11/2000 | Asahina et al. |
| 6,144,098 A | 11/2000 | Iyer |
| 6,150,246 A | 11/2000 | Parsons |
| 6,150,286 A | 11/2000 | Sun et al. |
| 6,150,672 A | 11/2000 | Kaneko |
| 6,166,487 A | 12/2000 | Negishi et al. |
| 6,190,975 B1 | 2/2001 | Kubo et al. |
| 6,198,113 B1 | 3/2001 | Grupp |
| 6,207,976 B1 | 3/2001 | Takahashi et al. |
| 6,222,267 B1 | 4/2001 | Omura et al. |
| 6,225,168 B1 | 5/2001 | Gardner et al. |
| 6,228,732 B1 | 5/2001 | Richardson et al. |
| 6,261,932 B1 | 7/2001 | Hulfachor |
| 6,268,233 B1 | 7/2001 | Sano |
| 6,274,905 B1 | 8/2001 | Mo |
| 6,284,557 B1 | 9/2001 | Yiu et al. |
| 6,287,946 B1 | 9/2001 | Micovic et al. |
| 6,291,282 B1 | 9/2001 | Wilk et al. |
| 6,291,866 B1 | 9/2001 | Wallace et al. |

(56) References Cited

U.S. PATENT DOCUMENTS

| | | |
|---|---|---|
| 6,291,867 B1 | 9/2001 | Wallace et al. |
| 6,293,137 B1 | 9/2001 | Liu et al. |
| 6,303,479 B1 | 10/2001 | Snyder |
| 6,303,942 B1 | 10/2001 | Farmer, II |
| 6,320,238 B1 | 11/2001 | Kizilyalli et al. |
| 6,323,508 B1 | 11/2001 | Takahashi et al. |
| 6,326,294 B1 | 12/2001 | Jang et al. |
| 6,339,232 B1 | 1/2002 | Takagi |
| 6,344,673 B1 | 2/2002 | Aussilhou |
| 6,346,465 B1 | 2/2002 | Miura et al. |
| 6,350,685 B1 | 2/2002 | Asahina et al. |
| 6,372,536 B1 | 4/2002 | Fischer et al. |
| 6,373,076 B1 | 4/2002 | Alok et al. |
| 6,380,021 B1 | 4/2002 | Wang et al. |
| 6,388,272 B1 | 5/2002 | Odekirk |
| 6,396,191 B1 | 5/2002 | Hagel et al. |
| 6,426,542 B1 | 7/2002 | Tan |
| 6,444,516 B1 | 9/2002 | Clevenger et al. |
| 6,451,690 B1 | 9/2002 | Matsumoto et al. |
| 6,452,244 B1 | 9/2002 | Miura et al. |
| 6,462,931 B1 | 10/2002 | Tang et al. |
| 6,468,890 B2 | 10/2002 | Bartsch et al. |
| 6,492,735 B1 | 12/2002 | Matsubara |
| 6,509,254 B1 | 1/2003 | Matsumoto et al. |
| 6,511,905 B1 | 1/2003 | Lee et al. |
| 6,511,910 B2 | 1/2003 | Asahina et al. |
| 6,555,455 B1 | 1/2003 | Wang et al. |
| 6,521,502 B1 | 2/2003 | Yu |
| 6,548,875 B2 | 4/2003 | Nishiyama |
| 6,559,069 B2 | 5/2003 | Goldbach et al. |
| 6,593,219 B2 | 7/2003 | Matsumoto et al. |
| 6,593,229 B1 | 7/2003 | Yamamoto et al. |
| 6,599,644 B1 | 7/2003 | Zekentes et al. |
| 6,605,832 B2 | 8/2003 | Van De Walle |
| 6,608,352 B1 | 8/2003 | Long et al. |
| 6,639,288 B1 | 10/2003 | Kunikiyo |
| 6,680,224 B2 | 1/2004 | Shin et al. |
| 6,724,068 B2 | 4/2004 | Matsuyama |
| 6,724,088 B1 | 4/2004 | Jammy et al. |
| 6,833,556 B2 | 12/2004 | Grupp et al. |
| 6,891,234 B1 | 5/2005 | Connelly et al. |
| 6,914,272 B2 | 7/2005 | Goetz et al. |
| 6,972,436 B2 | 12/2005 | Das et al. |
| 6,979,846 B2 | 12/2005 | Yagishita et al. |
| 6,995,430 B2 | 2/2006 | Langdo et al. |
| 7,057,333 B1 | 6/2006 | Vu Thien et al. |
| 7,084,423 B2 | 8/2006 | Grupp et al. |
| 7,112,478 B2 | 9/2006 | Grupp et al. |
| 7,176,483 B2 | 2/2007 | Grupp et al. |
| 7,382,021 B2 | 6/2008 | Faulkner et al. |
| 7,462,860 B2 | 12/2008 | Grupp et al. |
| 7,579,231 B2 | 8/2009 | Matsuo et al. |
| 7,816,240 B2 | 10/2010 | Faulkner et al. |
| 7,863,606 B2 | 1/2011 | Sung |
| 7,883,980 B2 | 2/2011 | Grupp et al. |
| 7,884,003 B2 | 2/2011 | Grupp et al. |
| 8,110,877 B2 | 2/2012 | Mukherjee et al. |
| 8,212,336 B2 | 7/2012 | Goebel et al. |
| 8,377,767 B2 | 2/2013 | Grupp et al. |
| 8,431,469 B2 | 4/2013 | Grupp et al. |
| 8,586,966 B2 | 11/2013 | Bangsaruntip et al. |
| 8,647,960 B2 | 2/2014 | Deweerd et al. |
| 8,658,523 B2 | 2/2014 | Faulkner et al. |
| 8,766,336 B2 | 7/2014 | Grupp et al. |
| 8,916,437 B2 | 12/2014 | Grupp et al. |
| 8,952,541 B2 | 2/2015 | Mukherjee et al. |
| 9,123,790 B2 | 9/2015 | Pillarisetty et al. |
| 9,209,261 B2 * | 12/2015 | Grupp .................. H01L 29/806 |
| 9,287,138 B2 | 3/2016 | Wang et al. |
| 9,362,376 B2 | 6/2016 | Harrison et al. |
| 9,425,277 B2 | 8/2016 | Grupp et al. |
| 9,461,167 B2 | 10/2016 | Grupp et al. |
| 9,905,691 B2 | 2/2018 | Grupp et al. |
| 9,978,835 B2 | 5/2018 | Yang et al. |
| 10,090,395 B2 | 10/2018 | Grupp et al. |
| 10,147,798 B2 | 12/2018 | Clifton et al. |
| 2001/0028067 A1 | 10/2001 | Awano |
| 2001/0030342 A1 | 10/2001 | Ohnishi et al. |
| 2001/0030352 A1 | 10/2001 | Ruf et al. |
| 2002/0017658 A1 | 2/2002 | Tsubouchi et al. |
| 2002/0061646 A1 | 5/2002 | Kan et al. |
| 2002/0098692 A1 | 7/2002 | Miura |
| 2002/0106536 A1 | 8/2002 | Lee et al. |
| 2002/0158250 A1 | 10/2002 | Fujisaki et al. |
| 2002/0163012 A1 | 11/2002 | Nihei et al. |
| 2002/0175386 A1 | 11/2002 | Kim |
| 2002/0179980 A1 | 12/2002 | Yagishita et al. |
| 2002/0179993 A1 | 12/2002 | Hshieh et al. |
| 2003/0009463 A1 | 1/2003 | Gallant |
| 2003/0012146 A1 | 1/2003 | Novaes |
| 2003/0015707 A1 | 1/2003 | Bosco et al. |
| 2003/0020069 A1 | 1/2003 | Holmes et al. |
| 2003/0020165 A1 | 1/2003 | Matsumoto |
| 2003/0022474 A1 | 1/2003 | Grover et al. |
| 2003/0098489 A1 | 5/2003 | Amos et al. |
| 2003/0109114 A1 | 6/2003 | Niwa |
| 2003/0121468 A1 | 7/2003 | Boone et al. |
| 2003/0127700 A1 | 7/2003 | Moddel et al. |
| 2003/0132452 A1 | 7/2003 | Boriuchi |
| 2003/0132466 A1 | 7/2003 | Shin et al. |
| 2003/0193074 A1 | 10/2003 | Hshieh et al. |
| 2003/0219965 A1 | 11/2003 | Cabral et al. |
| 2003/0235936 A1 | 12/2003 | Snyder et al. |
| 2004/0026687 A1 | 2/2004 | Grupp et al. |
| 2004/0038467 A1 | 2/2004 | Darwish et al. |
| 2004/0093575 A1 | 5/2004 | Heath et al. |
| 2004/0129087 A1 | 7/2004 | Rowe et al. |
| 2004/0142524 A1 | 7/2004 | Grupp et al. |
| 2004/0159865 A1 | 8/2004 | Allen et al. |
| 2005/0009302 A1 | 1/2005 | Wakui et al. |
| 2005/0037557 A1 | 2/2005 | Doczy et al. |
| 2005/0093027 A1 | 5/2005 | Grupp et al. |
| 2005/0104137 A1 | 5/2005 | Faulkner et al. |
| 2005/0104152 A1 | 5/2005 | Snyder et al. |
| 2006/0178015 A1 | 8/2006 | Verhaverbeke |
| 2007/0141798 A1 | 6/2007 | Bohr |
| 2008/0128760 A1 | 6/2008 | Jun et al. |
| 2008/0315256 A1 | 12/2008 | Jun et al. |
| 2011/0092047 A1 | 4/2011 | Gaines et al. |
| 2011/0147840 A1 | 6/2011 | Cea et al. |
| 2012/0181632 A1 | 7/2012 | Watanabe et al. |
| 2012/0280294 A1 | 11/2012 | Grupp et al. |
| 2012/0292665 A1 | 11/2012 | Marino et al. |
| 2013/0056833 A1 | 3/2013 | Takeoka |
| 2014/0001520 A1 | 1/2014 | Glass et al. |
| 2014/0035059 A1 | 2/2014 | Giles et al. |
| 2014/0041722 A1 | 2/2014 | Liang et al. |
| 2014/0117465 A1 | 5/2014 | Huang et al. |
| 2014/0135209 A1 | 5/2014 | Kaburagi et al. |
| 2014/0284666 A1 | 9/2014 | Grupp et al. |
| 2015/0001643 A1 | 1/2015 | Kim et al. |
| 2015/0067413 A1 | 3/2015 | Tripathi et al. |
| 2016/0148936 A1 | 5/2016 | Xu et al. |

FOREIGN PATENT DOCUMENTS

| | | |
|---|---|---|
| EP | 0 111 364 A2 | 6/1984 |
| EP | 0 168 125 A1 | 1/1986 |
| EP | 0295490 A1 | 12/1988 |
| EP | 0 458 353 B1 | 11/1991 |
| EP | 0 789 388 A2 | 8/1997 |
| EP | 0789388 A2 | 8/1997 |
| FR | 2 814 856 A1 | 4/2002 |
| GB | 1 22 594 A | 1/1919 |
| JP | S61-133646 A | 6/1986 |
| JP | S62-61363 A | 3/1987 |
| JP | S63-157466 A | 6/1988 |
| JP | S63-175471 A | 7/1988 |
| JP | H01-186672 A | 7/1989 |
| JP | H02-26073 A | 1/1990 |
| JP | H03-29355 A | 2/1991 |
| JP | H03-191518 A | 8/1991 |
| JP | H03-274735 A | 12/1991 |
| JP | H04-199628 A | 7/1992 |

(56) References Cited

FOREIGN PATENT DOCUMENTS

| | | |
|---|---|---|
| JP | H04-284668 A | 10/1992 |
| JP | H06-5737 B2 | 1/1994 |
| JP | H06-53165 A | 2/1994 |
| JP | H06-61177 A | 3/1994 |
| JP | H07-122519 A | 5/1995 |
| JP | H07-263375 A | 10/1995 |
| JP | H08-64800 A | 3/1996 |
| JP | H08-167693 A | 6/1996 |
| JP | 2630279 B2 | 7/1997 |
| JP | H09-289178 A | 11/1997 |
| JP | H10-27847 A | 1/1998 |
| JP | H10-74707 A | 3/1998 |
| JP | H10-135452 A | 5/1998 |
| JP | H10-209445 A | 8/1998 |
| JP | H10-335265 A | 12/1998 |
| JP | H11-26713 A | 1/1999 |
| JP | H11-162874 A | 6/1999 |
| JP | H11-233760 A | 8/1999 |
| JP | H11-330482 A | 11/1999 |
| JP | 2000-101064 A | 4/2000 |
| JP | 2000-101100 A | 4/2000 |
| JP | 2000-174261 A | 6/2000 |
| JP | 2000-195954 A | 7/2000 |
| JP | 2000-216241 A | 8/2000 |
| JP | 2000-228523 A | 8/2000 |
| JP | 2000-236086 A | 8/2000 |
| JP | 2000-299479 A | 10/2000 |
| JP | 3191728 B2 | 7/2001 |
| JP | 2001-223180 A | 8/2001 |
| JP | 3208599 B2 | 9/2001 |
| JP | 2002-075909 A | 3/2002 |
| JP | 2002-093742 A | 3/2002 |
| JP | 2002-151428 A | 5/2002 |
| JP | 2002-184978 A | 6/2002 |
| JP | 2002-217425 A | 8/2002 |
| KR | 1991-0006249 B1 | 8/1991 |
| KR | 92-002350 B1 | 3/1992 |
| KR | 1992-0010131 B1 | 11/1992 |
| KR | 1994-0020550 A | 9/1994 |
| KR | 1995-0010873 B1 | 9/1995 |
| KR | 1997-0030333 A | 6/1997 |
| KR | 1998-0024649 A | 7/1998 |
| KR | 1999-0025041 A | 4/1999 |
| KR | 10-0197653 B1 | 6/1999 |
| KR | 1999-0045323 A | 6/1999 |
| KR | 2000-0025576 A | 5/2000 |
| KR | 2000-0027908 A | 5/2000 |
| KR | 10-0290467 B1 | 3/2001 |
| SE | 0875077 T3 | 1/2004 |
| WO | WO 88/00392 A1 | 1/1988 |
| WO | WO 93/11558 A1 | 6/1993 |
| WO | WO 95/34095 A1 | 12/1995 |
| WO | WO 97/26678 A2 | 7/1997 |
| WO | WO 97/33308 A1 | 9/1997 |
| WO | WO 01/28677 A1 | 4/2001 |
| WO | WO 01/63677 A1 | 8/2001 |
| WO | WO 2002/043109 A2 | 5/2002 |
| WO | WO 2004/015782 A1 | 2/2004 |
| WO | WO 2004/030104 A1 | 4/2004 |
| WO | WO 2013/095343 A1 | 6/2013 |

OTHER PUBLICATIONS

*Acorn Semi, LLC v. Samsung Electronics Co., Ltd., et al.*, Case No. 2:19-cv-347-JRG (EDTX), Ex. A to Joint Claim Construction and Prehearing Statement, 9 pgs (Jul. 23, 2020).
*Acorn Semi, LLC v. Samsung Electronics Co., Ltd., et al.*, Case No. 2:19-cv-347-JRG (EDTX), Ex. B to Joint Claim Construction and Prehearing Statement, 8 pgs (Jul. 23, 2020).
*Acorn Semi, LLC v. Samsung Electronics Co., Ltd., et al.*, Case No. 2:19-cv-347-JRG (EDTX), Revised Joint Claim Construction and Prehearing Statement, 9 pgs (Aug. 20, 2020).
*Acorn Semi, LLC v. Samsung Electronics Co., Ltd., et al.*, Case No. 2:19-cv-347-JRG (EDTX), Ex. A to Revised Joint Claim Construction and Prehearing Statement, 7 pgs (Aug. 20, 2020).
*Acorn Semi, LLC v. Samsung Electronics Co., Ltd., et al.*, Case No. 2:19-cv-347-JRG (EDTX), Ex. B to Revised Joint Claim Construction and Prehearing Statement, 7 pgs (Aug. 20, 2020).
*Acorn Semi, LLC v. Samsung Electronics Co., Ltd., et al.*, Case No. 2:19-cv-347-JRG (EDTX), Plaintiff's Opening Claim Construction Brief, 39 pgs. (Aug. 21, 2020).
*Acorn Semi, LLC v. Samsung Electronics Co., Ltd., et al.*, Case No. 2:19-cv-347-JRG (EDTX), Defendant's Responsive Claim Construction Brief, 33 pgs. (Sep. 4, 2020).
*Acorn Semi, LLC v. Samsung Electronics Co., Ltd., et al.*, Case No. 2:19-cv-347-JRG (EDTX), Plaintiff's Reply Claim Construction Brief, 17 pgs. (Sep. 11, 2020).
*Acorn Semi, LLC v. Samsung Electronics Co., Ltd., et al.*, Case No. 2:19-cv-347-JRG (EDTX), Joint Claim Construction Chart, 20 pgs. (Sep. 18, 2020).
*Acorn Semi, LLC v. Samsung Electronics Co., Ltd., et al.*, Case No. 2:19-cv-347-JRG (EDTX), Joint Claim Construction Chart Appendices, 12 pgs. (Aug. 21, 2020).
*Acorn Semi, LLC v. Samsung Electronics Co., Ltd., et al.*, Case No. 2:19-cv-347-JRG (EDTX), Claim Construction Memorandum Opinion and Order, 40 pgs. (Oct. 16, 2020).
*Acorn Semi, LLC v. Samsung Electronics Co., Ltd., et al.*, Case No. 2:19-cv-347-JRG (EDTX), Order Correcting Typographical Error in Claim Construction Memorandum Opinion and Order, 2 pgs. (Nov. 18, 2020).
*Acorn Semi, LLC v. Samsung Electronics Co., Ltd., et al.*, Case No. 2:19-cv-347-JRG (EDTX), Order of Judge R. Gilstrap Adopting Claim Construction Memorandum Opinion and Order, 2 pgs. (Dec. 10, 2020).
*Acorn Semi, LLC v. Samsung Electronics Co., Ltd., et al.*, Case No. 2:19-cv-347-JRG (EDTX), Expert Report of Dr. Jeffrey Bokor Regarding Invalidity of U.S. Pat. No. 7,084,423, U.S. Pat. No. 8,766,336, U.S. Pat. No. 9,209,261, U.S. Pat. No. 9,461,167, U.S. Pat. No. 9,905,691, and U.S. Pat. No. 10,090,395 (Redacted) (Nov. 16, 2020).
Exhibit A to Expert Report of Dr. Jeffrey Bokor in *Acorn Semi, LLC v. Samsung Electronics Co., Ltd., et al.*, Case No. 2:19-cv-347-JRG (EDTX), CV of Dr. Jeffrey Bokor, 36 pgs. (Nov. 16, 2020).
Exhibit B to Expert Report of Dr. Jeffrey Bokor in *Acorn Semi, LLC v. Samsung Electronics Co., Ltd., et al.*, Case No. 2:19-cv-347-JRG (EDTX), Materials Considered in Connection with Report, 4 pgs. (Nov. 16, 2020).
Exhibit C to Expert Report of Dr. Jeffrey Bokor in *Acorn Semi, LLC v. Samsung Electronics Co., Ltd., et al.*, Case No. 2:19-cv-347-JRG (EDTX), Claim Chart re Anticipation of '336 Patent Based on U.S. Patent Publication 2005/0093027 ("Grupp") and U.S. Pat. No. 7,176,483, 38 pgs. (Nov. 16, 2020).
Exhibit D to Expert Report of Dr. Jeffrey Bokor in *Acorn Semi, LLC v. Samsung Electronics Co., Ltd., et al.*, Case No. 2:19-cv-347-JRG (EDTX), Claim Chart re Anticipation of '261 Patent Based on U.S. Patent Publication 2005/0093027 ("Grupp") and U.S. Pat. No. 7,176,483, 7 pgs. (Nov. 16, 2020).
Exhibit E to Expert Report of Dr. Jeffrey Bokor in *Acorn Semi, LLC v. Samsung Electronics Co., Ltd., et al.*, Case No. 2:19-cv-347-JRG (EDTX), Claim Chart re Anticipation of '167 Patent Based on U.S. Patent Publication 2005/0093027 ("Grupp") and U.S. Pat. No. 7,176,483, 16 pgs. (Nov. 16, 2020).
Exhibit F to Expert Report of Dr. Jeffrey Bokor in *Acorn Semi, LLC v. Samsung Electronics Co., Ltd., et al.*, Case No. 2:19-cv-347-JRG (EDTX), Claim Chart re Anticipation of '691 Patent Based on U.S. Patent Publication 2005/0093027 ("Grupp") and U.S. Pat. No. 7,176,483, 8 pgs. (Nov. 16, 2020).
Exhibit G to Expert Report of Dr. Jeffrey Bokor in *Acorn Semi, LLC v. Samsung Electronics Co., Ltd., et al.*, Case No. 2:19-cv-347-JRG (EDTX), Claim Chart re Anticipated of '395 Patent Based on U.S. Patent Publication 2005/0093027 ("Grupp") and U.S. Pat. No. 7,176,483, 8 pgs. (Nov. 16, 2020).
Exhibit H to Expert Report of Dr. Jeffrey Bokor in *Acorn Semi, LLC v. Samsung Electronics Co., Ltd., et al.*, Case No. 2:19-cv-347-JRG (EDTX), List of Claims by Grouping, 4 pgs. (Nov. 16, 2020).

(56) References Cited

OTHER PUBLICATIONS

*Acorn Semi, LLC* v. *Samsung Electronics Co., Ltd., et al.*, Case No. 2:19-cv-347-JRG (EDTX), Rebuttal Expert Report of Edwin Piner, Ph.D. (Redacted) (Dec. 14, 2020).

Aboelfotoh, Schottky Barrier Heights of Refractory Metals on Silicon, Materials Research Soc., vol. 71, 1986, pp. 273-285.

Aboelfotoh, et al., Schottky-barrier heights of Ti and TiSi2 on n-type and p-type Si(100), Physical Review B, vol. 34, No. 4, Aug. 15, 1986, pp. 2311-2317.

Aboelfotoh, et al., Schottky-barrier height of a Ti—W alloy on n-type and p-type Si, Physical Review B, vol. 33, No. 10, May 15, 1986, pp. 6572-6578.

Aboelfotoh, Temperature Dependence of the Schottky-Barrier Height of Tungsten on n-Type and p-Type Silicon, Solid-State Elecs, vol. 34, No. 1, 1991, pp. 51-55.

Asamizu, et al., Formation Mechanism of Low Contact Resistance PdZn-Based Ohmic Contacts for p-type InP, Materials Transactions, vol. 43, No. 6, 2002, pp. 1352-1359.

Bard, et al., The Concept of Fermi Level Pinning at Semiconductor/Liquid Junctions, Consequences for Energy Conversion Efficiency and Selection of Useful Solution Redox Couples in Solar Devices, Journal of the Am. Chem. Soc., vol. 12, No. 11, May 21, 1980, pp. 3671-3677.

Beatty, Metallization Systems for Integrated Circuits, NASA Technical Note D-5866, Jul. 1970., 26 pgs.

Boswell, Low Resistance Gold Contacts for Gallium Nitride, Gold Bulletin, vol. 31, No. 4, 1998, pp. 132-133.

Calvet, Electrical Transport in Schottky Barrier MOSFETS, Dissertation, Yale Univ., May 2001, 183 pgs.

Campbell, et al., Titanium dioxide (TiO2 )-based gate insulators, IBM Journal of Research Development, vol. 43, No. 3, May 1999, pp. 383-392.

Card, et al., Studies of tunnel MOS diodes I. Interface effects in silicon Schottky diodes, Journal of Applied. Physics, vol. 4, Jun. 1971, pp. 1589-1601.

Chang, et al., Specific Contact Resistance of Metal-Semiconductor Barriers, Solid-State Elecs., vol. 14, 1971, pp. 541-550.

Cheek, et al., MIS and SIS Silicon Solar Cells: A Review, Photovoltaic Solar Energy Conf., 1981, pp. 353-357.

Chen, et al., Band structure of Al/Si/n-type GaAs with a strained Si interfacial layer, Physical Review B, vol. 52, No. 7, Feb. 15, 1996, pp. 3879-3884.

Chen, et al., Properties of TiO2—GaAs Interface, Final Report on NASA Grant No. NSG 1202-S1, Jun. 1977, 100 pgs.

Chen, et al., The Use of Refractory Metal and Electron-Beam Sintering to Reduce Contact Resistance for VLSI, IEEE Trans. on Electron Devices, vol. ED-30, No. 11, Nov. 1983, pp. 1542-1550.

Chourasia, et al., X-ray photoelectron study of TiN/SiO2 and TiN/Si interfaces, Thin Solid Films, vol. 266, 1995, pp. 298-301.

Claflin, et al., Interface formation and thermal stability of advanced metal gate and ultrathin gate dielectric layers, Journal of Vacuum Sci., & Tech., vol. 16, No. 4, Jul./Aug. 1998, pp. 2154-2158.

Claflin, et al., Interface studies of tungsten nitride and titanium nitride composite metal gate electrodes with within dielectric layers, Journal of Vacuum Sci., & Tech., vol. 16, No. 3, May/Jun. 1998, pp. 1757-1761.

Clarke, et al., Non-Equilibrium Effects on Metal-Oxide-Semiconductor Tunnel Currents, Solid-State Elecs., vol. 14, 1971, pp. 957-973.

Cohen, et al., Chapter 6: Practical Ohmic Contacts to Silicon, VLSI Electronics Microstructure Sci., vol. 13, 1986, pp. 213-310.

Connelly, et al., Speed Advantage of Optimized Metal S/D in 25 nm Dual-Gate Fully-Depleted CMOS, 60th DRC Conf. Digest Device Research Conf., 2002, pp. 1-2.

Costa, et al., Unpinned GaAs Schottky barriers with an epitaxial silicon layer, Journal of Applied Physics, vol. 70, No. 4, Aug. 15, 1991, pp. 2173-2184.

Cowley, Titanium-Silicon Schottky Barrier Diodes, Solid-State Elecs., vol. 12, 1970, pp. 403-414.

Davis, et al., Low Temperature Deposition and Characterization of N- and P-Type Silicon Carbide Thin Films and Associated Ohmic and Schottky Contacts, Semiannual Technical Report, Jun. 1995, 32 pgs.

Depas, et al., Electrical Characteristics of Al/SiO2/n-Si Tunnel Diodes with an Oxide Layer Grown by Rapid Thermal Oxidation, Solid-State Elecs., vol. 37, No. 3, 1994, pp. 433-441.

D'Heurle, Interfaces in Silicides, Journal de Physique IV Colloque, vol. 6, Mar. 1996, pp. C2-29-C2-46.

D'Heurle, Silicide interfaces in silicon technology, Journal of Elec. Materials, vol. 27, No. 11, Nov. 1998, 16 pgs.

Dubois, et al., Low Schottky barrier source/drain for advanced MOS architecture: device design and material considerations, Solid-State Elecs., vol. 46, 2002, pp. 997-1004.

EMC Corp., 2002 EMC At-a-Glance: EMC Plenary Lecture/Student Awards, 2002 Elec. Materials Conf., Jun. 26, 2002, 107 pgs.

Eun, et al., High Temperature Ohmic Contact Technology to N-Type GaAs, ECE Technical Reports, Purdue Univ., Jan. 1993, 113 pgs.

Fan, et al., Very low resistance multilayer Ohmic contact to n-GaN, Applied Physics Letters, vol. 68, No. 12, Mar. 18, 1996, pp. 1672-1674.

Franciosi, et al., Heterojunction band offset engineering, Surface Sci. Reports, vol. 25, 1996, pp. 1-140.

Frangoul, et al., The Fabrication of Metal-Oxide Semiconductor Transistors Using Cerium Dioxide as a Gate Oxide Material, Journal of Vacuum Sci. & Tech, vol. 9, No. 1, Jan./Feb. 1991, pp. 181-183.

Fulton, et al., Electronic states at the interface of Ti—Si oxide on Si(100), Journal of Vacuum Sci. & Tech., vol. 20, No. 4, Jul./Aug. 2002, pp. 1726-1731.

Gessmann, et al., Ohmic contact technology in III nitrides using polarization effects of cap layers, Journal of Applied Physics, vol. 92, No. 7, Oct. 1, 2002, pp. 3740-3744.

Getto, et al., Characterization of sputtered titanium silicide ohmic contacts on n-type 6H-silicon carbide, Materials Sci. and Eng'g B61-62, 1999, pp. 270-274.

Giboney, Travelling-Wave Photodetectors, Thesis, Univ. of Calif. at Santa Barbara, Aug. 1995, 170 pgs.

Glass, et al., Low energy ion-assisted deposition of titanium nitride ohmic contacts on alpha (6H)-silicon carbide, Applied Physics Letters, vol. 59, No. 22, Nov. 25, 1991, pp. 2868-2870.

Gordon, 5—Depositions and Reactions of Metals and Metal Compounds, Harvard Univ., pp. 171-196.

Green, et al., Current Multiplication in Metal-Insulator-Semiconductor (MIS) Tunnel Diodes, Solid-State Elecs., vol. 17, 1974, pp. 349-365.

Green, et al., Minority Carrier MIS Tunnel Diodes and Their Application to Electron- and Photo-Voltaic Energy Conversion—I. Theory, Solid-State Elecs., vol. 17, 1974, pp. 551-561.

Grove, et al., Investigation of Thermally Oxidised Silicon Surfaces Using Metal-Oxide-Semiconductor Structures, Solid-State Elecs., vol. 8, 1965, pp. 145-163.

Guo, et al., High Quality Ultra-thin (1.5 nm) TiO2/Si3N4 Gate Dielectric for Deep Sub-micron CMOS Technology, IEEE, 1999, pp. 137-140.

Guo, et al., High Temperature Lifetesting of Silicon Metal-Thin Insulator-Semiconductor Heterojunction Emitter Bipolar Transistors, Solid-State Elecs., vol. 31, No. 6, 1998, pp. 1071-1075.

Hara, Characterization of the 6H—SiC(0001) surface and the interface with Ti layer with the Schottky limit, Applied Surface Sci., vol. 162-163, 2000, pp. 19-24.

Hara, et al., New Technique for Ohmic Formation, Materials Research Soc., vol. 427, 1996, pp. 159-164.

Hartstein, et al., Determination of the inversion-layer thickness from capacitance measurements of metal-oxide-semiconductor field-effect transistors with ultrathin oxide layers, Physical Review B, vol. 38, No. 2, Jul. 15, 1988, pp. 1235-1240.

Hasegawa, et al., Control of compound semiconductor-insulator interfaces by an ultrathin molecular-beam epitaxy Si layer, Journal of Vacuum Sci. & Tech., Vo. 7, No. 4, 1989, pp. 870-878.

(56) References Cited

OTHER PUBLICATIONS

Hasegawa, et al., Control of Structure and Properties of Compound Semiconductor Interfaces by Si Interface Control Layer, 1993 (5th) Int'l Conf. on Indium Phosphide & Related Materials, 1993, pp. 289-292.

Hasegawa, et al., Correlation Between Atomic-Scale Structures and Macroscopic Electrical Properties of Metal-Covered Si(111) Surfaces, Int'l Journal of Modern Physics B, vol. 7, No. 22, 1993, pp. 3817-3876.

Hasegawa, Fermi Level Pinning and Schottky Barrier Height Control at Metal-Semiconductor Interfaces of InP and Related Materials, Japanese Journal of Applied Physics, vol. 38, 1999, p. 1098-1102.

Ho, et al., Low-resistance ohmic contacts of p-type GaN achieved by the oxidation of Ni/Au films, Journal of Applied Physics, vol. 86, No. 8, Oct. 1999, pp. 4491-4497.

Hofmann, et al., In situ fabrication of vertical tunnel junctions for SET devices, Microelec Eng'g, vols. 57-58, 2001, pp. 851-856.

Horiguchi, et al., Evaluation of interface potential barrier heights between ultrathin silicon oxides and silicon, Journal of Applied Physics, vol. 58, No. 4, 1985, pp. 1597.

Horváth, et al., The effect of the metal-semiconductor interface on the barrier height in GaAs Schottky junctions, Vacuum, vol. 41, No. 4, 1990, pp. 804-806.

Hudait, et al., Interface states density distribution in Au/n-GaAs Schottky diodes on n-Ge and n-GaAs substrates, Materials Sci. & Eng'g, vol. B87, 2001, pp. 141-147.

Hui, et al., Specific Contact Resistivity of $TiSi_2$ to p+ and n+ Junctions, IEEE Electron Device Letters, vol. EDL-6, No. 9, Sep. 1985, pp. 479-481.

Ilderem, et al., Investigation of the Effects of Very Low Pressure Chemical Vapor Deposited $TiSi_2$ on Device Electrical Characteristics, Journal Electrochem. Soc., vol. 136, No. 10, Oct. 1989, pp. 2989-2993.

Ingerly, et al., Low resistance ohmic contacts to n-GaN and n-AlGaN, Applied Physics Letters, vol. 77, No. 3, Jul. 17, 2000, pp. 382-384.

Itoh, et al., Analysis of Schottky Barrier Heights of Metal/SiC Contacts and Its Possible Application to High-Voltage Rectifying Devices, Physica Status Solidi, vol. 162, 1997, pp. 389-408.

ITRS, Process Integration, Devices, and Structures and Emerging Research Devices, 2001 Ed., 51 pgs.

Ivančo, et al., Electrical Characterization of Au/SiOx/n-GaAs Junctions, Solid-State Elecs., vol. 42, No. 2, 119, pp. 229-233.

Ivančo, et al., Schottky barrier height dependence on the silicon interlayer thickness of Au/Si/n-GaAs contacts: chemistry of interface formation study, Vacuum, No. 50, Issues 3-4, Jul. 1998, pp. 407-411.

Ivančo, et al., Unpinning of the Au/GaAs interfacial Fermi level by means of ultrathin undoped silicon interlayer inclusion, Journal of Applied Physics, vol. 87, No. 2, Jan. 15, 2000, pp. 795-800.

Ivey, Platinum Metals in Ohmic Contacts to III-V Semiconductors, Platinum Metals Research, vol. 43, No. 1, 1999, pp. 2-12.

Jacobs, et al., Optimisation of the Ti/Al/Ni/Au ohmic contact on AlGaN/GaN FET structures, Journal of Crystal Growth, vol. 241, 2002, pp. 15-18.

Kar, et al., Interface States in MOS Structures with 20-40 Å Thick $SiO_2$ Films on Nondegenerate Si*, Solid-State Elecs., vol. 15, 1972, pp. 221-237.

Kasai, Control of Metal/III-V Compound Semiconductor Interfaces and Its Application to Quantum Effect Devices, Thesis, Hokkaido Univ., Dec. 1996, 309 Pgs.

Kedzierski, Complementary silicide thin-body silicon-on-insulator CMOS devices, Thesis, U.C. Berkeley, 2001, 134 pgs.

Kim, et al., Low-Resistance Ti/Al Ohmic Contact on Undoped ZnO, Journal of Elec Materials, vol. 31, No. 8, 2002, pp. 868-871.

Kipperman, et al., Improved efficiency of MIS-silicon solar cells by HF treatment of the oxide layer, Applied Physics Letters, vol. 28, No. 620, 1976, pp. 620-621.

Kobayashi, et al., Studies of interface states at ultrathin $SiO_2$/Si(100) interfaces by means of x-ray photoelectron spectroscopy under biases and their passivation by cyanide treatment, Journal of Applied Physics, vol. 83, No. 4, Feb. 15, 1998, pp. 2098-2103.

Kolodzey, et al., Electrical Conduction and Dielectric Breakdown in Aluminum Oxide Insulators on Silicon, IEEE Trans. on Electron Devices, vol. 47, No. 1, Jan. 2000, pp. 121-128.

LaBrasca, et al., Scanning tunneling microscopy and spectroscopy on pn junctions formed by ion implantation, Journal of Vacuum Sci. & Tech., vol. 9, Mar./Apr. 1991, pp. 752-757.

Lee, et al., Effects of interfacial layer growth on the electrical characteristics of thin titanium oxide films on silicon, Journal of Applied Physics, vol. 74, No. 21, May 24, 1999, pp. 3143-3145.

Lee, et al., Ohmic contact formation mechanism of nonalloyed contacts to p-type GaN observed by positron annihilation spectroscopy, Applied Physics Letters, vol. 74, No. 16, Apr. 19, 1999, pp. 2289-2291.

Lee, Processing and Characterization of Silicon Carbide (6H- and 4H-SiC) Contacts for High Power and High Temperature Device Applications, Ph.D. Dissertation, KTH, Royal Institute of Technology, 2002, 106 pgs.

Leprince-Wang, et al., Study of the growth morphology of $TiO_2$ thin films by AFM and IEM, Surface and Coatings Tech., vol. 140, 2001, pp. 155-160.

Levy, et al., Selective LPCVD Tungsten for Contact Barrier Applications, Journal Electrochem. Soc., vol. 133, No. 9, Sep. 1986, pp. 1905-1912.

Liauh, et al., Electrical and microstructural characteristics of Ti contacts on (001)Si, Journal of Applied Physics, vol. 74, No. 4, Aug. 15, 1993, pp. 2590-2597.

Lillington, et al., Effects of interfacial oxide layers on the performance of silicon Schottky-barrier solar cells, Applied Physics Letters, vol. 28, No. 2, Jan. 15, 1976, pp. 97-98.

Lin, et al., A novel Pd/oxide/GaAs metal-insulator-semiconductor field-effect transistor (MISFET) hydrogen sensor, Semiconductor Sci. Tech., vol. 16, 2002, pp. 997-1001.

Lin, et al., Low resistance ohmic contacts on wide band-gap GaN, Applied Physics Letters, vol. 64, No. 8, Feb. 1994, pp. 1003-1005.

Look, et al., Unpinning of GaAs Surface Fermi Level by 200 Degrees C Molecular Beam Epitaxial Layer, Applied Physics Letters, vol. 57, No. 24, Dec. 10, 1990, pp. 2570-2572.

Lucovsky, Reaction/annealing pathways for forming ultrathin silicon nitride films for composite oxide-nitride gate dielectrics with nitrided crystalline silicondielectric interfaces for application in advanced complementary metal-oxide-semiconductor devices, Journal of Vacuum Sci. & Tech A, vol. 17, No. 4, Jul./Aug. 1999, pp. 1340-1351.

Lue, et al., A method to characterize the dielectric and interfacial properties of metal-insulator-semiconductor structures by microwave measurement, Journal of Applied Physics, vol. 91, No. 8, Apr. 15, 2002, pp. 5275-5282.

Luther, et al., Analysis of a thin AlN interfacial layer in Ti/Al and Pd/Al ohmic contacts to n-type GaN, Applied Physics Letters, vol. 71, No. 26, Dec. 29, 1997, pp. 3859-3861.

Maeda, et al., A Highly Reliable Interconnection for a BF2-Implanted Junction Utilizing TiN/Ti Barrier Metal System, IEEE Trans. of Electron Devices, vol. ED-34, No. 3, Mar. 1987, pp. 599-606.

Mahalingam, Trench MOS Based Power Devices with Graded Doped Profile, Thesis, No. Carolina Univ., 1999, 295 pgs.

Mamor, et al., Schottky Barrier Heights on IV-IV Compound Semiconductors, Journal of Elec Materials, vol. 25, No. 11, Nov. 1996, pp. 1748-1753.

Marinova, et al., Nickel based ohmic contacts on SiC, Materials Sci. & Eng'g, vol. B46, 1997, pp. 223-226.

Matsuzawa, et al., A Unified Simulation of Schottky and Ohmic Contacts, IEEE Trans. on Electron Devices, vol. 47, No. 1, Jan. 2000, pp. 103-108.

Miller, et al., Ohmic Contacts to n-Type GaN, Journal of Elec Materials, vol. 25, No. 11, 1996, pp. 1709-1714.

Mönch, Electron properties of ideal and interface-modified metal-semiconductor interfaces, Journal of Vacuum Sci. & Tech. B, vol. 14, No. 4, Jul./Aug. 1998, pp. 2985-2993.

Morita, et al., Growth of native oxide on a silicon surface, Journal of Applied Physics, vol. 68, No. 3, Aug. 1990, pp. 1272-1281.

(56) References Cited

OTHER PUBLICATIONS

Muret, et al., Unpinning of the Fermi level at erbium silicide/silicon interfaces, Physical Review B, vol. 56, No. 15, Oct. 15, 1997, pp. 9286-9289.
Nakasaki, et al., Tungsten/titanium nitride low-resistance interconnections durable for high-temperature processing, Journal of Applied Physics, vol. 64, No. 8, Sep. 15, 1988, pp. 3263-3268.
Nielsen, Current mechanism of tunnel m.i.s. solar cells, IEE Proceedings, vol. 127, Part 1, No. 6, Dec. 1980, pp. 301-307.
Nielsen, Current Mechanism of Tunnel MIS Solar Cells, IEE Proceedings, vol. 129, Part 1, No. 4, Aug. 1982, pp. 153-156.
O'Donnell, et al., Temperature dependence of semiconductor band gaps, Applied Physics Letters, vol. 58, No. 25, Jun. 24, 1991, pp. 2924-2926.
Okada, et al., Electrical Characteristics and Reliability of Pt/Ti/Pt/Au Ohmic Contacts to p-Type GaAs, Japanese Journal of Applied Physics, vol. 30, No. 4A, Apr. 1991, pp. L558-L560.
O'Meara, et al., Experimental Design Study of Coincident Titanium Nitride/Titanium Silicide Formation from Rapid Thermal Processing, Materials Research Soc. Symposium Proceedings, Vo. 260, 1992, pp. 805-811.
Oskam, et al., Electrochemical deposition of metals onto silicon, Journal of Applied Physics, vol. 31, 1998, pp. 1927-1949.
Park, et al., Impact of atomic-layer-deposited TiN on the gate oxide quality of W/TiN/SiO2/Si metal-oxide-semiconductor structures, Applied Physics Letters, vol. 80, No. 14, Apr. 8, 2002, pp. 2514-2516.
Park, et al., Improved Low Resistance Contacts of Ni/Au and Pd/Au to p-Type GaN Using a Cryogenic Treatment, Cambridge Univ. Press, Jun. 13, 2014, 6 pgs.
Park, et al., Metal-insulator-semiconductor structure on GaAs using a pseudomorphic Si/GaP interlayer, Journal of Vacuum & Sci. Tech., vol. 15, Mar./Apr. 1997, pp. 252-258.
Park, et al., Si3N4/Si/In0.05Ga0.95As/n-GaAs metal-insulator-semiconductor devices, Journal of Applied Physics, vol. 81, No. 1, Jan, 1, 1997, pp. 516-523.
Park, et al., Thermal stability of molybdenum-silicon nitride-silicon Schottky diodes, Journal of Applied Physics, vol. 69, No. 5, Mar. 1, 1991, pp. 3149-3153.
Patkar, et al., Very low resistance nonalloyed ohmic contacts using low-temperature molecular beam epitaxy of GaAs, Am. Institute of Physics, vol. 66, No. 11, Mar. 13, 1996, pp. 1412-1414.
Plummer, et al., Material and Process Limits in Silicon VLSI Technology, IEEE, vol. 89, No. 3, Mar. 2000, pp. 240-258.
Polishchuk, et al., Dual Work Function Metal Gate CMOS Technology Using Metal Interdiffusion, IEEE Electron Device Letters, vol. 22, No. 9, Sep. 2001, pp. 444-446.
Porter, et al., Effect of Interfacial Oxide Layers on the Current-Voltage Characteristics of Al—Si Contacts, NASA Contracte #NAS8-26379, Nov. 1976, 67 Pgs.
Proctor, et al., Direct Measurements of Interfacial Contact Resistance, End Contact Resistance, and Interfacial Contact Layer Uniformity, IEEE Trans. of Electron Devices, vol. ED-30, No. 11, Nov. 1983, pp. 1535-1542.
Ren, Nanoscale MOSFETS: Physics, Simulation and Design, Thesis, Purdue Univ., Oct. 2001, 211 pgs.
Rhoderick, Metal-semiconductor contacts, IEEE Proceedings, vol. 129, Part 1, No. 1, Feb. 1982, pp. 1-14.
Rhoderick, The physics of Schottky barriers, Review of Physics in Tech., 1970, pp. 81-95.
Richards, Novel Uses of Titanium Dioxide of Solar Cells, Thesis, Univ. of New South Wales, Apr. 2002, 259 pgs.
Rohdin, et al., Interfacial Gate Resistance in Schottky-Barrier-Gate Field-Effect Transistors, Hewlett-Packard Company, 1998, pp. 1-25.
Sambell, et al., Unpinning the GaAs Fermi Level with Thin Heavily Doped Silicon Overlayers, IEEE Trans. of Electron Devices, vol. 37, No. 1, Jan. 1990, pp. 88-95.
Schenk, Halbleiterbauelemente—Physikalische Grundlagen und Simulation, Integrated Sys Lab, Dec. 18, 2001, 177 pgs.
Schenk, Semiconductor components Physical basics and simulation, Integrated Sys Lab, Dec. 18, 2001, 5 pgs.
Semi. Indus. Assocation, The International Technology Roadmap for Semiconductors 2001 Edition—Interconnect, 2001, pp. 1-25.
Sharma, Influence of thin inversion layers on Schottky diodes, Revue de Physique Applicquee, vol. 21, Jan. 1986, pp. 25-33.
Shewchun, Metal-Insulator-Semiconductor (MIS) and Semiconductor-Insulator-Semiconductor (SIS) Solar Cells: 1. Basic Principles, 1979, pp. 843-867.
Shewchun, et al., MIS and SIS Solar Cells, IEEE Trans. On Electron Devices, vol. ED-27, vol. 4, Apr. 1980, pp. 705-716.
Shewchun, et al., Theory of metal-insulator-semiconductor solar cells, Journal of Applied Physics, vol. 48, Nov. 2, Feb. 1977, pp. 765-770.
Shih, et al., Effects of interfacial microstructure on uniformity and thermal stability of AuNiGe ohmic contact to n-type GaAs, Journal of Applied Physics, vol. 62, No. 2, Jul. 15, 1987, pp. 582-590.
Singh, Theory of Metal-Insulator-Semiconductor (MIS) and Semiconductor-Insulator-Semiconductor (SIS) Solar Cells, Thesis, McMaster University, Apr. 1979, 365 pgs.
Smith, et al., Chemical Vapour Deposition of the Oxides of Titanium, Zironium and Hafnium for Use as High-k Materials in Microelectronic Devices. A Carbon-free Precursor for the Synthesis of Hafnium Dioxide, Adv. Materials for Optics and Elecs, vol. 10, 2000, pp. 105-114.
Sobolewski, et al., Analysis of Thin Thermal Silicon Nitride Films on Silicon, Applied Surface Sci., vol. 30, 1987, pp. 210-215.
Sobolewski, et al., Studies of barrier height mechanisms in metal-silicon nitride-silicon Schottky barrier diodes, Journal of Sci. Tech., vol. 7, No. 4, Jul./Aug. 1989, pp. 971-979.
Song, et al., Effects of sulfur passivation on Ti/Al ohmic contacts to n-type GaN using CH3CSNH2 solution, Applied Physics Letters, vol. 80, No. 17, Apr. 29, 2002, pp. 3129-3131.
Spicer, et al., Study of the Electronic Surface States of III-V Compounds and Silicon, DARPA Order No. 3564, Program Code No. HX 1241, Oct. 1, 1981, 158 pgs.
Spicer, et al., Unified Mechanism for Schottky-Barrier Formation and III-V Oxide Interface States, Physical Review Letters, vol. 44, No. 6, Feb. 11, 1980, pp. 420-423.
Srivastava, et al., Theory of Metal-Oxide-Semiconductor Solar Cells, Solid-State Elecs., vol. 22, 1987, pp. 581-587.
Streetman, Solid State Electronic Devices, Fourth Ed., Prentice-Hall, Inc., 1995, 91 pgs.
Suguro, et al., Reaction Kinetics in Tungsten/Barrier Metal Silicon Systems, Thin Solid Films, vol. 166, 1988, pp. 1-14.
Taboryski, et al., Superconductor-Semiconductor-Superconductor Planar Junctions of Aluminum on δ-doped Gallium-Arsenide, IEEE Trans. on Applied Superconductivity, vol. 7, No. 2, Jun, 2, 1997, pp. 2809-2813.
Taubeblatt, et al., Interface effects in titanium and hafnium Schottky barriers on silicon, Applied Physics Letters, vol. 44, No. 9, May 1, 1984, pp. 895-897.
Taubenlatt, et al., Silicide and Schottky barrier formation in the Ti—Si and the Ti—SiOx—Si systems, Journal of Applied Physics, vol. 53, No. 9, Sep. 1982, pp. 6308-6315.
Teraji, et al., Ideal Ohmic contact to n-type 6H-SiC by reduction of Schottky barrier height, Applied Physics Letters, vol. 71, No. 5, Aug. 1997, pp. 689-691.
Thanailakis, Contacts between simple metals and atomically clean silicon, Journal of Physics C: Solid State Physics, vol. 8, 1975, pp. 655-668.
Thanailakis, et al., Transition-metal contacts to atomically clean silicon, Journal of Physics C: Solid State Physics, vol. 9, 1976, pp. 337-343.
Tiwari, et al., Unpinned GaAs MOS Capacitors and Transistors, IEEE Electron Device Letters, vol. 9, No. 9, Sep. 1988, pp. 488-490.
Topham, Ohmic Contacts to N-Type Indium Phosphide, Thesis, Univ. of Surrey, Sep. 1983, 176 pgs.
Tsutsumi, et al., A Selective LPCVD Tungsten Process Using Silane Reduction for VLSI Applications, IEEE Trans. on Electron Devices, vol. 37, No. 3, Mar. 1990, pp. 569-576.
Tucker, Dynamic Capacitance of Metal-Oxide-Semiconductor Field-Effect Transistors, Thesis, Univ. of Missouri, 1968, 82 pgs.

(56) References Cited

OTHER PUBLICATIONS

Tung, Schottky-Barrier Formation of Single-Crystal Metal-Semiconductor Interfaces, Physical Review Letters, vol. 52, No. 6, Feb. 6, 1984, pp. 461-464.
Turner, et al., Metal-Silicon Schottky Barriers, Solid-State Elecs., vol. 11, 1968, pp. 291-300.
Van Otterloo, Schottky Barriers on Clean-Cleaved Silicon, Surface Science, vol. 104, 1981, pp. L205-L209.
Vilinaus Univ., The Metal-Semiconductor Junction. Schottky Diode Ohmic Contacts, Vilinaus Univ., Semiconductor Physics Dept., Lithuania, downloaded Jan. 25, 2020, 18 pgs.
Waldrop, et al., Formation and Schottky barrier height of metal contacts to β-SiC, Applied Physics Letters, vol. 56, No. 6, Feb. 5, 1990, pp. 557-559.
Waldrop, et al., Metal Schottky barrier contacts to alpha 6H—SiC, Journal of Applied Physics, vol. 72, No. 10, Nov. 15, 1992, pp. 4757-4760.
Waldrop, et al., Wide range of Schottky barrier height for metal contacts to GaAs controlled by Si interface layers, Journal of Vacuum Sci. & Tech. B, vol. 4, No. 4, Jul./Aug. 1988, pp. 1432-1435.
Walukiewicz, Mechanism of Schottky Barrier Formation: The Role of Amphoteric Native Defects, Lawrence Berkeley Nat'l Lab., Feb. 1, 1987, 23 pgs.
Werner, et al., Barrier inhomogeneities at Schottky contacts, Journal of Applied Physics, vol. 69, No. 3, Feb. 1, 1991, pp. 1522-1533.
Weste, et al., Principles of CMOS Technology: A Systems Perspective, Second Ed., Addison Wesley Longman, 1993, 749 pgs.
Williams, Interfaces in Semiconductor Structures and Devices, Physik Bl., vol. 45, Nr, 7, 1989, pp. 219-222.
Williams, Metal-Semiconductor Interfaces, The Physics of Submicron Semiconductor Devices, 1988, pp. 683-701.
Wilson, et al., Differential Capacitance-Voltage Profiling of Schottky Barrier Diodes for Measuring Implanted Depth Distributions in Silicon, U.S. Dept. of Commerce, Nat'l Bureau of Standards, Feb. 1982, 68 pgs.
Wittmer, et al., Ideal Schottky Diodes on Passivated Silicon, Physical Review Letters, vol. 69, No. 18, Nov. 2, 1993, pp. 2701-2704.
Wu, Barrier height reduction of the Schottky barrier diode using a thin highly doped surface layer, Journal of Applied Physics, vol. 51, No. 9, Sep. 1980, pp. 4919-4922.
Wu, et al., Interface capacitance in metal-semiconductor junctions, Journal of Applied Physics, vol. 65, No. 9, May 1, 1989, pp. 3560-3567.
Yang, et al., Tunneling in a Metal-Semiconductor-Semiconductor Thin-Film Diode, Solid-State Elec., vol. 29, No. 3, 1986, pp. 355-357.
Yen, et al., Thermally Assisted Multiphoton Photoelectric Emission from Tungsten, Optics Communications, vol. 35, No. 2, Nov. 1980, pp. 277-282.
Zafar, A method for measuring barrier heights, metal work functions and fixed charge densities in metal/SiO2/Si capacitors, Applied Physics Letters, vol. 80, No. 25, Jun. 24, 2002, pp. 4858-4860.
Zaima, et al., Electrical Properties and Crystallographic Structures of Transition Metal/Silicon Interface, Materia Japan, vol. 33, No. 6, 1994, pp. 691-696.
Zaima, et al., Formation of silicide at metal/silicon interface and low-resistivity contacts, Applied Physics, vol. 63, No. 11, 1994, pp. 1093-1105.
Zaima, et al., Study on determining factors of low contact resistivity in transition metal-silicon systems, Applied Surface Science, vols. 70/71, 1993, pp. 624-628.
Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 79 pgs.
Appendix A1, Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 5 pgs.
Appendix A2., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 7 pgs.
Appendix A3., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 19 pgs.
Appendix A4., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 21 pgs.
Appendix A6., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 15 pgs.
Appendix A7., Claim Chart, from Defendants' Preliminary Invalidity Contentions and Additional Disclosures Pursuant to Patent Local Rules dated May 19, 2020,*Acorn Semi, LLC v. Samsung Electronics Co., Ltd; et al.*, Civil Action No. 2:19-cv-347-JRG, 26 pgs.
Appendix A8., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 28 pgs.
Appendix A10., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 18 pgs.
Appendix B1, Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 41 pgs.
Appendix B2., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 43 pgs.
Appendix B3., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 48 pgs.
Appendix B4., Claim Chart, from Defendants' Preliminary Invalidity Contentions and Additional Disclosures Pursuant To Patent Local Rules dated May 19, 2020, Acorn Semi, Llc v. Samsung Electronics Co., Ltd; et al., Civil Action No. 2:19-cv-347-JRG, 48 pgs.
Appendix B5., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 47 pgs.
Appendix B6., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 32 pgs.
Appendix B7., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 42 pgs.
Appendix B8., Claim Chart, from Defendants' Preliminary Invalidity Contentions and Additional Disclosures Pursuant to Patent

(56) References Cited

OTHER PUBLICATIONS

Local Rules dated May 19, 2020, *Acorn Semi, LLC* v. *Samsung Electronics Co., Ltd; et al.*, Civil Action No. 2:19-cv-347-JRG, 41 pgs.

Appendix B10., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 30 pgs.

Appendix C1., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 5 pgs.

Appendix C2., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 5 pgs.

Appendix C3., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 7 pgs.

Appendix C4., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 9 pgs.

Appendix C5., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 9 pgs.

Appendix C6., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 8 pgs.

Appendix C7., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 9 pgs.

Appendix C8., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 9 pgs.

Appendix C10., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 4 pgs.

Appendix D1., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 16 pgs.

Appendix D2., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 20 pgs.

Appendix D3., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 14 pgs.

Appendix D4., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 11 pgs.

Appendix D5., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 16 pgs.

Appendix D6., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 12 pgs.

Appendix D7., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 22 pgs.

Appendix D8., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 15 pgs.

Appendix D10., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 21 pgs.

Appendix E1, Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 8 pgs.

Appendix E2., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 8 pgs.

Appendix E3., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 8 pgs.

Appendix E4., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 8 pgs.

Appendix E5., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 8 pgs.

Appendix E6., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 8 pgs.

Appendix E7., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 8 pgs.

Appendix E8., Claim Chart, from Defendants' Preliminary Invalidity Contentions and Additional Disclosures Pursuant to Patent Local Rules dated May 19, 2020, *Acorn Semi, LLC* v. *Samsung Electronics Co., Ltd; et al.*, Civil Action No. 2:19-cv-347-JRG, 8 pgs.

Appendix E10., Claim Chart, from Defendants' Preliminary Invalidity Contentions and Additional Disclosures Pursuant to Patent

(56) References Cited

OTHER PUBLICATIONS

Local Rules dated May 19, 2020, *Acorn Semi, LLC v. Samsung Electronics Co., Ltd; et al.*, Civil Action No. 2:19-cv-347-JRG, 8 pgs.
Appendix F1., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 13 pgs.
Appendix F2., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 15 pgs.
Appendix F3., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 11 pgs.
Appendix F4., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 15 pgs.
Appendix F5., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 9 pgs.
Appendix F6., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 9 pgs.
Appendix F7., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 17 pgs.
Appendix F8., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 17 pgs.
Appendix F10., Claim Chart, from Defendants' Preliminary Invalidity Contentions and Additional Disclosures Pursuant to Patent Local Rules dated May 19, 2020, *Acorn Semi, LLC v. Samsung Electronics Co., Ltd; et al.*, Civil Action No. 2:19-cv-347-JRG, 11 pgs.
De Bosscher, et al., The influence of silicide formation on the barrier height of Ti/Si MIS Schottky barriers, Semiconductor Sci., Tech., vol. 1, 1986, pp. 376-382.
Defives, et al., Electrical behaviour and microstructural analysis of metal Schottky contacts on 4H-SiC, Microelec. Eng'g, vol. 55, 2001, pp. 369-374.
Goodnick, et al., Effects of a thin $SiO_2$ layer on the formation of metal-silicon contacts, Journal of Vacuum Sci. & Tech., vol. 18, No. 3, Apr. 1981, pp. 949-954.
Schmidt, et al., Increased dependence of Schottky barrier height on metal work functions due to athin-oxide layer, Journal of Vacuum Sci. & Tech., vol. 6, No. 4, Jul./Aug. 1988, pp. 1436-1439.
Waldrop, et al., Schottky barrier height and interface chemistry of annealed metal contacts to alpha 6H-SiC: Crystal face dependence, Applied Physics Letters, vol. 62, No. 21, May 24, 1993, pp. 2685-2687.
Archibong, et al., On the Structure of $Al2O3$ and Photoelectron Spectra of $Al2O2$ and $Al2O3$; J. Phys. Chem.A 1999, 103, pp. 1109-1114.
Bortz, et al., Temperature Dependence of the Electronic Structure of Oxides: MgO, $MgAl2O4$ and $Al2O3$; Physica Scripta., col. 41, pp. 537-541, 1990.
Carver, et al., Specific Contact Resistivity of Metal-Semiconductor Contacts—A New, Accurate Method Linked to Spreading Resistance; IEEE Transactions on Electron Devices, vol. 35, No. 4, Apr. 1988, pp. 489-497.
Lide, David R., CRC Handbook of Chemistry and Physics, Internet Version 2005; <http://www.hbcpnetbase.com>, CRC Press, Boca Raton, FL, 2005; 11 pp.
Distefano, et al., The Band Edge of Amorphous $SiO2$ By Photoinjection and Photoconductivity Measurements; Solid State Communications, vol. 9, pp. 2259-2261, 1971, Pergamon Press; Printed in Great Britain.
Fitting, et al., Monte-Carlo Approach of Electron Emission from $SiO2$; Phys. Stat. Sol. (a) 81, 323 (1984) pp. 323-332.
IPR2020-01182; *Samsung Electronics Co., Ltd. v. Acorn Semi, LLC*; Declaration of Dr. E. Fred Schubert; Jun. 23, 2020; 139 pp.
IPR2020-01182; *Samsung Electronics Co., Ltd. v. Acorn Semi, LLC*; Petition for Inter Partes Review of U.S. Pat. No. 7,084,423; Jun. 24, 2020; 76 pp.
IPR2020-01183; *Samsung Electronics Co., Ltd. v. Acorn Semi, LLC*; Declaration of Dr. E. Fred Schubert; Jun. 24, 2020; 178 pp.
IPR2020-01183; *Samsung Electronics Co., Ltd. v. Acorn Semi, LLC*; Petition for Inter Partes Review of U.S. Pat. No. 9,209,261; Jun. 24, 2020; 81 pp.
IPR2020-01204; *Samsung Electronics Co., Ltd. v. Acorn Semi, LLC*; Declaration of Dr. E. Fred Schubert; Jun. 29, 2020; 178 pp.
IPR2020-01204; *Samsung Electronics Co., Ltd. v. Acorn Semi, LLC*; Petition for Inter Partes Review of U.S. Pat. No. 8,766,336; Jun. 29, 2020; 78 pp.
IPR2020-01205; *Samsung Electronics Co., Ltd. v. Acorn Semi, LLC*; Declaration of Dr. E. Fred Schubert; Jun. 29, 2020; 142 pp.
IPR2020-01205; *Samsung Electronics Co., Ltd. v. Acorn Semi, LLC*; Petition for Inter Partes Review of U.S. Pat. No. 9,461,167; Jun. 29, 2020; 63 pp.
IPR2020-01206; *Samsung Electronics Co., Ltd. v. Acorn Semi, LLC*; Declaration of Dr. E. Fred Schubert; Jun. 29, 2020; 164 pp.
IPR2020-01206; *Samsung Electronics Co., Ltd. v. Acorn Semi, LLC*; Petition for Inter Partes Review of U.S. Pat. No. 9,905,691; Jun. 29, 2020; 76 pp.
IPR2020-01207; *Samsung Electronics Co., Ltd. v. Acorn Semi, LLC*; Declaration of Dr. E. Fred Schubert; Jun. 29, 2020; 146 pp.
IPR2020-01207; *Samsung Electronics Co., Ltd. v. Acorn Semi, LLC*; Petition for Inter Partes Review of U.S. Pat. No. 10,090,395; Jun. 29, 2020; 66 pp.
IPR2020-01241; *Samsung Electronics Co., Ltd. v. Acorn Semi, LLC*; Declaration of Dr. E. Fred Schubert; Jul. 6, 2020; 165 pp.
IPR2020-01241; *Samsung Electronics Co., Ltd. v. Acorn Semi, LLC*; Petition for Inter Partes Review of U.S. Pat. No. 9,461,167; Jul. 6, 2020; 84 pp.
IPR2020-01264; *Samsung Electronics Co., Ltd. v. Acorn Semi, LLC*; Declaration of Dr. E. Fred Schubert; Jul. 8, 2020; 194 pp.
IPR2020-01264; *Samsung Electronics Co., Ltd. v. Acorn Semi, LLC*; Petition for Inter Partes Review of U.S. Pat. No. 8,766,336; Jul. 8, 2020; 83 pp.
IPR2020-01279; *Samsung Electronics Co., Ltd. v. Acorn Semi, LLC*; Declaration of Dr. E. Fred Schubert; Jul. 9, 2020; 182 pp.
IPR2020-01279; *Samsung Electronics Co., Ltd. v. Acorn Semi, LLC*; Petition for Inter Partes Review of U.S. Pat. No. 9,905,691; Jul. 10, 2020; 84 pp.
IPR2020-01282; *Samsung Electronics Co., Ltd. v. Acorn Semi, LLC*; Declaration of Dr. E. Fred Schubert; Jul. 12, 2020; 217 pp.
IPR2020-01282; *Samsung Electronics Co., Ltd. v. Acorn Semi, LLC*; Petition for Inter Partes Review of U.S. Pat. No. 10,090,395; Jul. 13, 2020; 85 pp.
Lang et al., Theory of Metal Surfaces: Work Functon *; Physical Review B, vol. 3, No. 4; Feb. 15, 1971; pp. 1215-1223.
Rohatgi et al., Comprehensive Study of Rapid, Low-Cost Silicon Surface Passivation Technologies; IEEE Transactions on Electron Devices, vol. 47, No. 5, May 2000; pp. 987-993.
Sakurai, et al., Alpha-Power Law MOSFET Model and its Applications to CMOS Inverter Delay and Other Formulas; IEEE Journal of Solid-State Circuits, Vo. 25, No. 2, Apr. 1990, pp. 584-594.
Simmons, John G., Generalized Formula for the Electric Tunnel Effect Between Similar Electrodes Separated by a Thin Insulating Film; Journal of Applied Physics, vol. 34, No. 6, Jun. 1963; pp. 1793-1803.
Stesmans et al., Si Dangling-Bond-Type Defects at the Interface of (100)Si with Ultrathin Layers of $SiO_x$, $Al2O3$, anti $ZrO2$; Applied Physics Letters, vol. 80, No. 11, Mar. 18, 2002; pp. 1957-1959.
Szydlo, et al., I-V and C-V Characteristics of $Au/TiO2$ Schottky Diodes; J. Appl. Phys. 51(6), Jun. 1980; pp. 3310-3312.

(56) References Cited

OTHER PUBLICATIONS

Zheng et al., Electronic Structure Differences in ZeO2 vs HfO2; J. Phys. Chem. A 2005, 109, pp. 11521-11525.
Moore, Administrative Patent Judge, "Judgement", *Samsung Electronics Co., Ltd., v. Acorn Semi, LLC*, IPR2020-01204, Paper 48 (FWD) (PTAB Jan. 12, 2022), 55 pgs.
McNamara, Administrative Patent Judge, "Judgement", *Samsung Electronics Co., Ltd., v. Acorn Semi, LLC*, IPR2020-01205, Paper 51 (FWD) (PTAB Jan. 12, 2022), 52 pgs.
Kenny, Administrative Patent Judge, "Decision", *Samsung Electronics Co., Ltd., v. Acorn Semi, LLC*, IPR2020-01206, Paper 49 (FWD) (PTAB Jan. 12, 2022), 53 pgs.
McNamara, Administrative Patent Judge, "Judgement", *Samsung Electronics Co., Ltd., v. Acorn Semi, LLC*, IPR2020-01279, Paper 55 (FWD) (PTAB Jan. 12, 2022), 54 pgs.
"Patents Act 1977: Examination Report under Section 18(3)", UK Intellectual Property Office dated Apr. 29, 2015, Application No. GB1409999.8 (filed Oct. 18, 2012), 5 pgs.
"Research Achievements", Research Achievements at RCIQE, downloaded Apr. 12, 2002, from: http://www.rciqe.hokudai.ac.jp/RCIQEold/ResearchAchievements.html, 8 pgs.
Aberle, Armin G., et al., "Injection-Level Dependent Surface Recombination Velocities at The Silicon-Plasma Silicon Nitride Interface", Institute fur Solarenergieforschung, ISFH, D-3 1860 Emmerthal, Germany, (Mar. 9, 1995), pp. 2828-2830.
Aboelfotoh, "Influence of thin interfacial silicon oxide layers on the Schottky-barrier behavior of Ti on Si(100)", Phys Rev B Condens Matter (Mar. 1989), 39(8):5070-5078.
Acorn Technologies, Inc., International Application No. PCT/US2012/060893 filed Oct. 18, 2012, ISA/US, International Search Report and Written Opinion, dated Dec. 11, 2012, 23 pages.
Acorn Technologies, Inc., International Search Report and Written Opinion, PCT/US2005/030209 dated Mar. 2, 2006, 8 pp.
Adam; et al., "Experimental Identification of Nitrogen-Vacancy Complexes in Nitrogen Implanted Silicon", Applied Physics Letters (Jul. 2001), 79(5):623-625.
Agrawal; et al., "Fermi level depinning and contact resistivity reduction using a reduced titania interlayer in n-silicon metal-insulator-semiconductor ohmic contacts", Applied Physics Letters (2014), 104(11):112101-1-112101-4.
Alers; et al., "Effects of Thermal Stability and Roughness on Electrical Properties of Tantalus Oxide Gates", MRS Proceedings (1999), 567:391-395.
Almeida; et al., "Reaction-Diffusion Model For Thermal Growth of Silicon Nitrite Films on Si", Physical Review B (Dec. 2000), 62(24):R16255-R16258.
Bannikov; et al., "Field-Effect Transistor With Metal-(Tunneling-Insulator)-Semiconductor Contacts and a Gate Insulator Made of A Mangmuir-Blodgett Film", Soviet Technical Physics Letters (Mar. 1989), 15(3):211-212.
Bauernschmitt, et al., "Transition from MOS to Schottky-contract behaviour in Yb—SiO2—Si Tunneling Junctions with extremely thin SiO2 layer", Microelectronic Engineering (1993), 22:105-108.
Baumvol, "Atomic Transport During Growth of Ultrathin Dielectrics on Silicon", Surface Science Reports (Dec. 1999), 36(1-8):1-166.
Berger, "Contact Resistance and Contact Resistivity" J. Electrochem. Soc.: Solid-State Science and Technology (1972), 119(4):507-514.
Blosse; et al., "A Novel Low Cost 65nm CMOS Process Architecture With Self Aligned Isolation and W Cladded Source/Drain", IEEE, Transactions of 2004 International Electron Device Meeting (Jan. 2005), pp. 669-672.
Bringans, "Arsenic Passivation of Si and Ge Surfaces", Critical Reviews in Solid State and Materials Sciences I(1992), 17(4):353-395.
Cai; et al., "Investigation of The Properties of Plasma-Enhanced Chemical Vapor Deposition Silicon Nitride And its Effect on Silicon Surface Passivation", Journal of Applied Physics (May 1998), 83(II):5885-5889.

Card; et al., "Studies of tunnel MOS diodes I. Interface effects in silicon Schottky diodes", Journal of Physics D: Applied Physics (1971), 4(10):1589-1601.
Chadi; et al., "Fermi-Level-Pinning Defects in Highly n-Doped Silicon", Physical Review Letters (Dec. 1997), 79(24):4834-4837.
Chaneliere; et al., "Tantalum Pentoxide (Ta2O5) Thin Films for Advanced Dielectric Applications"; Materials Science and Engineering, R: Reports (May 1998), 22(6):269-322.
Chen; et al., "High Quality Native-Oxide-Free Ultrathin Oxide Grown by In-Situ HF-Vapor Treatment", Electronic Letters, (May 2000), 36(11):981-983.
Connelly; et al., "Improved Short-Channel n-FET Performance with Virtual Extensions," Abstracts of the 5th International Workshop on Junction Technology (2005), 4 pages.
Connelly; et al., "Optimizing Schottky S/D Offset for 25-nm Dual-Gate CMOS Performance", Electron Device Letters, IEEE (Jun. 2003), 24(6)411-413.
Edelstein; et al., "Full Copper Wiring in a Sub-0.25 mm CMOS ULSI Technology", Proceedings of the IEEE International Electron Device Meeting (1997), pp. 773-776.
Fischer, S.; et al., "Dopant-free complementary metal oxide silicon field effect transistors," Phys. Status Solidi A 213, No. 6, pp. 1494-1499 (2016).
Gilmer; et al., "Process and Manufacturing Challenges For High-K Gate Stack Systems", MRS Proceedings, MRS Spring Meeting (1999), 567:323-341.
Gopalakrishnan; et al., "Impact Ionization MOS (I-MOS)—Part 1: Device and Circuit Simulations", IEEE Transactions Electron Devices (Jan. 2005), 52(1):69-76.
Hara, et al., "Control of Schottky And Ohmic Interfaces by Unpinning Fermi Level", Applied Surface Science (1997), 117-118:394-399.
Hara; et al., "Pinning-Controlled Metal/Semiconductor Interfaces", Proc. SPIE 3rd International Conference on Intelligent Materials and 3rd European Conference on Smart Structures and Materials (Apr. 1996), 2779:802-807.
Hara; et al., "Pinning-Controlled Ohmic Contacts: Application to SiC(0001)", Applied Surface Science (Nov. 1996), 107:218-221.
Hasegawa; et al., "Unpinning of Fermi Level in Nanometer-Sized Schottky Contacts on GaAs and InP", Applied Surface Science (2000): 166:92-96.
Hayafuji; et al., "Nitridation of Silicon and Oxidized-Silicon", J. Electrochem. Soc. (1982), 129(9):2102-2108.
Heine, "Theory of Surface States", Physical Review (Jun. 1965), 138(6A):83-4.
Heinzig; et al., "Reconfigurable Silicon Nanowire Transistors", Nano Letters, vol. 12, pp. 119-124 (2012).
Hilsenbeck; et al., "Aging Behavior of Algan HFETs With Advanced Ohmic And Schottky Contacts", Electronic letters (May 2000), 38(11):980-981.
Huang, "Metal-Oxide Semiconductor Field-Effect Transistors Using Schottky Barrier Drains", Electronics Letters (1797), 33(15):1341-1342.
Huang; et al., "Two-Dimensional Numerical Simulation of Schottky Barrier MOSFET with Channel Length to 10 nn", IEEE (Apr. 1998), pp. 842-848.
International Search Report and Written Opinion of the International Searching Authority, Patent Cooperation Treaty (dated Mar. 2, 2006), PCT/US2005/030209, 6 pgs.
International Search Report and Written Opinion dated Mar. 8, 2018, from the ISA/European Patent Office, for International Patent Application No. PCT/US2017/062296 (filed Nov. 17, 2017), 22 pages.
International Search Report, PCT/US03/25057, dated Dec. 18, 2003, 4 pgs.
International Search Report, PCT/US2004/042084, dated Sep. 1, 2005, 4 pgs.
Izumi, "43 Hydrogen Termination: The Ideally Finished Silicon Surface", Ultraclean Surface Processing of Silicon Wafers (1998), pp. 559-565.
Kamins; et al., "Effect of Hydrogen on p-Type Epitaxial Silicon Sheet-Resistance Measurements", Electrochemical and Solid-State Letters (1998), 1(2):100-101.

(56) References Cited

OTHER PUBLICATIONS

Kamiyama; et al., "Ultrathin Tantalum Odise Capacitor Dielectric Layers Fabricated Using Rapid Thermal Nitridation Prior to Low Pressure Chemical Vapor Deposition", J. Electrochem Soc. (1993), 140(6)1617.

Kaxiras, "Efthimios. Semiconductor-surface restoration by valence-mending adsorbates: Application to Si (100): S and Si (100): Se", Phys Rev B Condens Matter (Mar. 1991), 43(18):6824-6827.

Kedzierski; et al., "Extension and Source/Drain Design for High-Performance FinFET Devices", IEEE Trans. Electron Devices (Apr. 2003), 50(4):952-958.

Keller; et al., "Calculations of the barrier height and charge distribution of a metal-dielectric interface", Journal of Vacuum Science & Technology A: Vacuum, Surfaces, and Films (Jul. 1992), 10(4):775-780.

Kim; et al., "Metal-Dependent Fermi-Level Movement in The Metal/Sulfer-Passivated InGaP Contact", Journal of Vacuum Science & Technology A: Vacuum, Surfaces, and Films (1997), 15(3):1124-1128.

Kimura; et al., "A New Type of Schottky Tunnel Transistor", IEEE Electron Device Letters (Oct. 1994), 15(10): 412-414.

Lee; et al., "Electronic Property of Metallic Nanoclusters on Semiconductor Surfaces: Implications For Nanoelectronic Device Applications", Journal of Nanoparticle Research (Dec. 2000), 2(4):345-362.

Louie; et al., "Ionicity And The Theory of Schottky Barriers", Physical Review B (Feb. 1977), 15(4):2154-2162.

Majumdar; et al., "Statistical demonstration of silicide-like uniform and ultra-low specific contact resistivity using a metal/high-k/Si stack in a sidewall contact test structure", 2014 Symposium on VLSI Technology Digest of Technical Papers (Jun. 9-12, 2014), INSPEC Accession No. 14582372, 0743-1562, 2 pgs.

Mandelis; et al., "Evidence of a Surface Acceptor State in Undoped Semi-Insulating GaAs by Photothermal Radiometric Deep Level Transient Spectroscopy", Sociedad Mexicana de Ciencias de Superficies y de Vacio, (1999), 8:13-17.

Martel; et al., "Ambipolar Single-Wall Carbon Nanotube Transistors and Inverters", AIP Conference Proceedings (Mar. 2001). 591:543-547.

Martinez; et al., "Quantum-Transport Study on the Impact of Channel Length and Cross Sections on Variability Induced by Random Discrete Dopants in Narrow Gate-All-Around Silicon Nanowire Transistors," IEEE Trans. Electron Devices, 58(8):2209-2217 (2011).

McKee; et al., "Physical Structure and Inversion Charge at a Semiconductor Interface With a Crystalline Oxide", Science (Jul. 2001), 293(5529):468-471.

McKinley; et al., "Control of Ge homojunction band offsets via ultrathin Ga—As dipole layers," J. Vac. Sci. Technol. A 9(3):917-21, May/Jun. 1991.

McKinley; et al., "Control of Ge homojunction band offsets via ultrathin Ga—As dipole layers", Applied Surface Science (1992), 56-58(Part 2):762-765.

McKinley; et al., "Controlled modification of heterojunction band lineups by diffusive intralayers", Journal of Vacuum Science & Technology A Vacuum Surfaces and Films (May/Jun. 1990), 8(3):1917-21.

Miyawaki; et al., "Improvement of Aluminum-Si Contact Performance in Native-Oxide-Free Processing", IEEE Electron Device Letters (Oct. 1990), 11(10):448-450.

Nauka; et al., "Surface Photovoltage Measurement of Hydrogen-Treated Si Surfaces", Journal of Electrochemical Society (1999), 146(1):292-295.

Nishioka; et al., "Dielectric Characteristics of Fluorinated Ultradry SiO2", Appl. Phy. Letters (Mar. 1989), 54(12):1127-1129.

Okamoto; et al., "Near-Ohmic Contact of n-GaAs with GaS/GaAs Quaisi-Metal-Insulator-Semiconductor Structure", Jpn. J. Appl. Phys. (1998), 37:3248-3251.

Padovani, "Forward Voltage-Current Characteristics of Metal-Silicon Schottky Barriers", Journal of Applied Physics (1967), 38(2):891-892.

Park; et al., "Thermal stability of molybdenum-silicon nitride-silicon Schottky diodes", Journal of Applied Physics (Mar. 1991), 69(5):3149-3153.

Park, S.-H.; et al., "Scaling effect on specific contact resistivity in nano-scale metal-semiconductor contacts", 16th Int'l Workshop on Computational Electronics, Nara, Japan (Jun. 4-7, 2013), pp. 134-135.

Park, S.-H.; et al., "Scaling effect on specific contact resistivity in nano-scale metal-semiconductor contacts", Proc. Device Research Conference (2013), pp. 125-126.

Patel; et al., "Arsenic Atom Location on Passive Silicon (111) Surfaces", Physical Review B (Nov. 1987), 36(14):7715-17.

Porter; et al., "A Critical Review of Ohmic and Rectifying Contacts For Silicon Carbide", Material Science and Engineering: B (Nov. 1995), 34(2-3):83-105.

Ren; et al. "Metal I Silicon Schottky Barrier Lowering By RTCVD Interface Passivation" Electrochemical Society Proceedings (2000), 2000-9:161-166.

Ruzyllo; et al., "Semiconductor Glossary An Introduction to Semiconductor Terminology", Prosto Multimedia Publishing (2004), pp. 26.

Schmidt; et al., "Carrier Recombination at Silicon-Silicon Nitride Interfaces Fabricated by Plasma-Enhanced Chemical Vapor Deposition", Journal of Applied Physics (Apr. 1999), 85(7):3626-3633.

Shalish; et al., "Yellow Luminescence And Fermi Level Pinning in GaN Layers", Appl Phys Lett (Aug. 2000), 77(7):987-989.

Snyder; et al., "Experimental Investigation of a PtSi Source And Drain Field Emission Transister", Appl Phys Lett (1995), 67:1420-1422.

Sobolewski; et al., "Properties of Ultrathin Thermal Nitrides in Silicon Schottky Barrier Structures", Applied Physics Letters, American Institute of Physics (1989), 54(7):638-640.

Sobolewski; et al., "Studies of barrier height mechanisms in metal-silicon nitride-silicon Schottky barrier diodes", Journal of Vacuum Science & Technology B (1989), 7:971-979.

Spicer; et al., "Unified Mechanism For Schottky-Barrier Formation And III-V Oxide Interface States", Physical Review Letters (Feb. 1980), 44(6):420-423.

Sze, "Metal-Semiconductor Contacts", Physics of Semiconductor Devices, John Wiley & Sons, (1981), pp. 245-311.

Takahagi; et al., "The formation of hydrogen passivated silicon singlecrystal surfaces using ultraviolet cleaning and HF etching", J Appl Phys (1988), 64(7):3516-21.

Tao; et al., "Negative Schottky barrier between titanium and n-type Si(001) for low-resistance ohmic contacts", Solid State Electron (Feb. 1, 2004), 48(2):335-338.

Tao; et al., "Removal of dangling bonds and surface states on silicon (001) with a monolayer of selenium", Applied Physics Letters (Mar. 2003), 82(10)1559-1561.

Tao; et al., "Suppression of silicon (001) surface reactivity using a valence-mending technique", Solid State Communications (Oct. 2004), 132(2):89-92.

Taubenblatt; et al., "Interface effects in titanium and hafnium Schottky barriers on silicon", Appl Phys Lett (May 1984), 44:895-897.

Teraji; et al., "Ohmic Contacts To n-Type 6H-SiC Without Post-Annealing", Material Research Society, MRS Spring Meeting (1996), 423:149-154.

Tersoff, "Schottky Barrier Heightsand The Continuum of Gap States", Physical Review Letters (Feb. 1984), 52(6):465-468.

Thanailakis; et al., "Transition-metal contacts to atomically clean silicon, Department of Electrical Engineering and Electronics", Journal of Physics C: Solid State Physics (1976), 9:337-343.

Thompson; et al., "A Logic Nanotechnology Featuring Strained-Silicon", IEEE Electron Device Letters (Apr. 2004),25(4):191-193.

Tung, "Electron Transport of Inhomogeneous Schottky Barriers", Appl Phys Letter (1991), 58(24):2821-2823.

Udeshi; et al., "Thermal stability of ohmic contacts between Ti and Sepassivated n-type Si(001)", J Appl Phys (2004), 95(8):4219-4222.

(56) References Cited

OTHER PUBLICATIONS

Uemoto, "Reduction of Ohmic Contact Resistance on N-Type 6H-SIC By Heavy Doping", Japanese Journal of Applied Physics (Jan. 1995), 34(Parts 2, No. 1A).

Verhaverbeke; et al., "Surface Characterization of Si After HF Treatments and its Influence in the Dielectric Breakdown of Thermal Oxides", MRS Proceedings (1992), 259:391-399.

Wang; et al., "High Barrier GaN Schottky Diodes: Pt/GaN and Pd/GaN", Appl. Phys. Letters (Feb. 1996), 68(9):1267-1270.

Wei; et al., "The Use of Selective Electroless Metal Deposition For Micron Size Contact Fill", IEEE International Electron Device Meeting Technical Digest (1988), pp. 446-449.

Weinberger; et al., "Surface Chemistry of HF Passivation Silicon: X-Ray Photoelectron And Ion Scattering Spectroscopy Results", J. Appl. Phys (Nov. 1986), 60(9):3232-34.

Widjaja; et al., "Ab Initlo Study and Decomposition of NH3 on Si(100)-(2×1)", J. Phy. Chem B, (2000), 104:2527-2533.

Wittmer; et al., "Ideal Schottky diodes on passivated silicon", Phys Rev Lett (Nov. 1992), 69(18):2701-2704.

Wolf; et al., "Spintronics: A Spin-Based Vision For The Future", Science (Nov. 2001), 294(5546):1488-95.

Wright; et al., "Hot-Electron Immunity of SiO2 Dielectrics with Fluorine Incorporation", IEEE Electron Device Letters (1989), 10(8):347-348.

Yablonovitch; et al., "Unusually Low Surface-Recombination Velocity on Silicon and Germanium Surfaces", Physical Review Letters (Jul. 1986), 57(2):249-252.

Yagishita; et al., "High Performance Damascene Metal Gate MOSFET's for 0.1 mm Regime", IEEE Trans. Electron Devices (2000), 47(5):1028-1034.

Yang; et al., "The Effects of Interfacial Sub-Oxide Transition Regions and Monolayer Level Nitridation on Tunneling Currents in Silicon Devices", IEEE Electron Device Letters (2000), 21(2):76-78.

Yu, Hao, et al., "Thermal Stability Concern of Metal-Insulator-Semiconductor Contact—A Case Study of Ti/TiO$_2$/n-Si Contact", IEEE Transactions on Electron Devices (2016), 6 pages.

Zhang; et al., "Schottky diodes of NiÔAu on n-GaN grown on sapphire and SiC substrates", Applied Physics Letters (Oct. 2001), 79(16):2567-69.

Zhu; et al., "Low-Resistance Ti/n-Type Si(100) Contacts by Monolayer Se Passivation", ECS Trans (2006), 2(2):401-409.

Zhu; et al., "Stability of Se passivation layers on Si(001) surfaces characterized by time-of-flight positron annihilation induced Auger electron spectroscopy", Journal of Applied Physics (2005), 97(10):103510-1103510-4.

\* cited by examiner

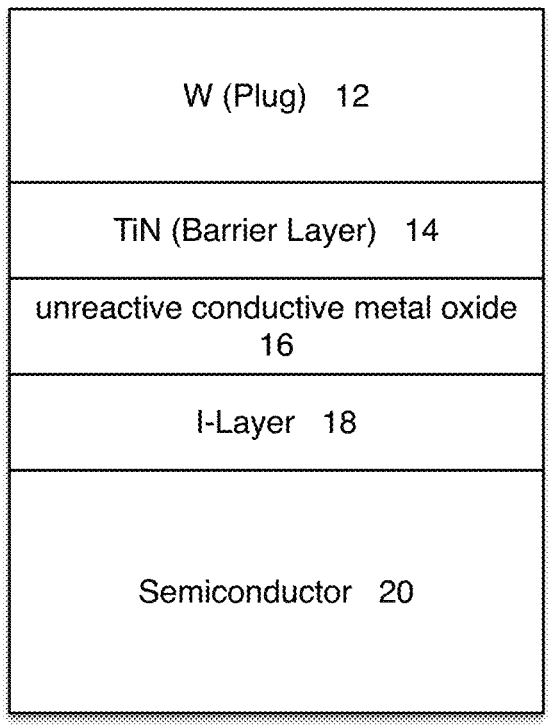
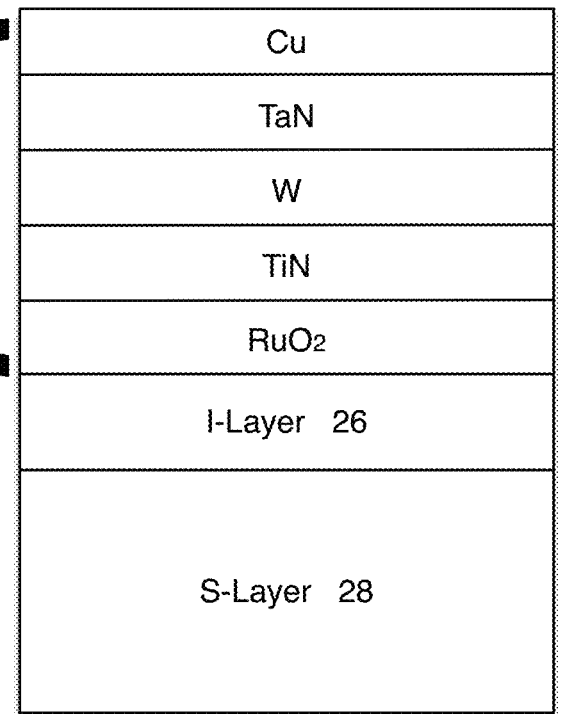
FIG. 1
FIG. 2

MIS CONTACT STRUCTURE WITH METAL OXIDE CONDUCTOR

RELATED APPLICATIONS

This is a CONTINUATION of U.S. application Ser. No. 16/742,098, filed 14 Jan. 2020, which is a CONTINUATION of U.S. application Ser. No. 16/175,637, filed 30 Oct. 2018, now U.S. Pat. No. 10,553,695, which is a CONTINUATION of U.S. application Ser. No. 15/451,164, filed 6 Mar. 2017, now U.S. Pat. No. 10,147,798, which is a CONTINUATION of U.S. application Ser. No. 15/186,378, filed 17 Jun. 2016, now U.S. Pat. No. 9,620,611, each of which is incorporated herein by reference.

FIELD OF THE INVENTION

The present invention relates to what are generally known in the art as metal-insulator-semiconductor (MIS) electrical contacts, and in particular, such contacts in which the "insulator" is an interfacial dielectric layer that is an oxide of a metal, an oxide of a semiconductor, or both, and the "metal" is a conductive metal oxide.

BACKGROUND

Metal-semiconductor contact resistivity is an important consideration in the fabrication of field effect transistors and becomes increasingly important as the dimensions of the contacts are scaled down and currently approach ten nanometers. MIS contacts are a relatively recent technological development, and may provide a contact resistivity that is lower than the resistivity of the equivalent direct metal-semiconductor contact between the same metal and semiconductor pair. As described in the Applicant's U.S. Pat. No. 7,084,423, incorporated herein by reference, a very thin, interfacial dielectric layer between the metal and semiconductor acts to reduce the Schottky barrier at the junction and at the same time has sufficient conductivity, despite being itself a dielectric with poor bulk electronic conduction, to provide a net improvement in the conductivity of the MIS junction.

SUMMARY OF THE INVENTION

Described herein is an electrical contact structure including a conductor; a semiconductor (e.g., a group IV semiconductor such as silicon, germanium, or an alloy mixture of silicon, germanium, carbon, or tin; a group IV compound semiconductor such as SiC; a III-V compound semiconductor; a II-VI compound semiconductor; a two-dimensional semiconductor such as graphene, phosphorene; or a transition metal dichalcogenide such as monolayer molybdenum disulfide; or carbon nanotubes); and an interfacial dielectric layer of less than 4 nm thickness disposed between and in contact with both the conductor and the semiconductor, wherein the conductor is a conductive metal oxide, and wherein the interfacial dielectric layer is an oxide of a metal, an oxide of a semiconductor, or a mixture of both. Although the term "metal" is often used in the literature (as in "metal-insulator-semiconductor" contact), herein, we adopt the term "conductor" when referring to the conductive metal oxide in order to emphasize this nature of the contact element. In various embodiments, the electrical contact structure has a specific contact resistivity of less than or equal to approximately $10^{-5}$-$10^{-7}$ $\Omega$-$cm^2$ when the doping in the semiconductor adjacent the MIS contact is greater than approximately $2\times10^{19}$ $cm^{-3}$ and less than approximately $10^{-8}$ $\Omega$-$cm^2$ when the doping in the semiconductor adjacent the MIS contact is greater than approximately $10^{20}$ $cm^{-3}$. In various embodiments the interfacial dielectric layer may be a material that is an insulator or a semiconductor in its bulk state. In some embodiments, the interfacial dielectric layer has a thickness in the range 0.2 nm to 4 nm, and may be one of: $TiO_2$, $SrTiO_3$, $MgO$, $Al_2O_3$, $HfO_2$, $ZrO_2$, $Ta_2O_5$, $V_2O_5$, $BaZrO_3$, $La_2O_3$, $Y_2O_3$, $HfSiO_4$, $ZrSiO_4$, $CoO$, $NiO$, $ZnO$, $SiO_2$. The conductive metal oxide layer may, in some embodiments, have a thickness in the range 0.5 nm to 3 nm and may be one of: $(Nb,Sr)TiO_3$, $(Ba,Sr)TiO_3$, $SrRuO_3$, $MoO_2$, $OsO_2$, $WO_2$, $RhO_2$, $RuO_2$, $IrO_2$, $ReO_3$, $ReO_2$, $LaCuO_3$, $Ti_2O_3$, $TiO$, $V_2O_3$, $VO$, $Fe_3O_4$, $ZnO$, $InSnO$ or $CrO_2$. In some embodiments, the interfacial dielectric layer includes a separation layer (e.g., a further insulating oxide layer separating the conductor and the semiconductor). Preferably, the junction between the conductive metal oxide layer and the interfacial dielectric layer is chemically stable up to a temperature of 400° C. and more preferably, the junction between the conductive metal oxide layer and the interfacial dielectric layer is chemically stable up to a temperature of 450° C. For example, there is preferably no chemical reaction between the conductive metal oxide layer and the interfacial dielectric layer that substantially consumes the interfacial dielectric up to a temperature of 400° C. and more preferably no such chemical reaction up to a temperature of 450° C. Also, or alternatively, the contact resistivity of the device is preferably less than or equal to approximately $10^{-7}$ $\Omega$-$cm^{-2}$ after the device is heated to a temperature of 400° C. More preferably, the contact resistivity of the device remains less than or equal to approximately $10^{-7}$ $\Omega$-$cm^{-2}$ after the device is heated to a temperature of 450° C. In some embodiments, the conductive metal oxide layer of the electrical contact structure is contacted by a thin metal layer of a different metal, such as W, Ag, Al, Ta, Co, or Cr. Although examples of materials that may comprise the interfacial dielectric layer are specified herein, persons of ordinary skill in the art will appreciate that such materials may not have the precise stoichiometry of the examples. For instance, $TiO_2$ may more preferably be described as $TiO_x$, with x less than or equal to 2 but greater than 1.5. Similar non-stoichiometric variants of the metal oxides described herein, together with mixed metal oxides and mixtures of metal and silicon or germanium oxides should be understood to be within the scope of the present invention. In some cases, non-stochiometric and also doped variants of the metal oxides exhibit semiconducting or even conducting properties, even if their undoped stoichiometric variants are considered dielectrics.

BRIEF DESCRIPTION OF THE DRAWINGS

The present invention is illustrated by way of example, and not limitation, in the figures of the accompanying drawings, in which:

FIG. 1 illustrates an example of an MIS contact structure according to an embodiment of the present invention.

FIG. 2 illustrates a further example of an MIS contact structure according to an embodiment of the present invention.

DETAILED DESCRIPTION

Figure 3A:
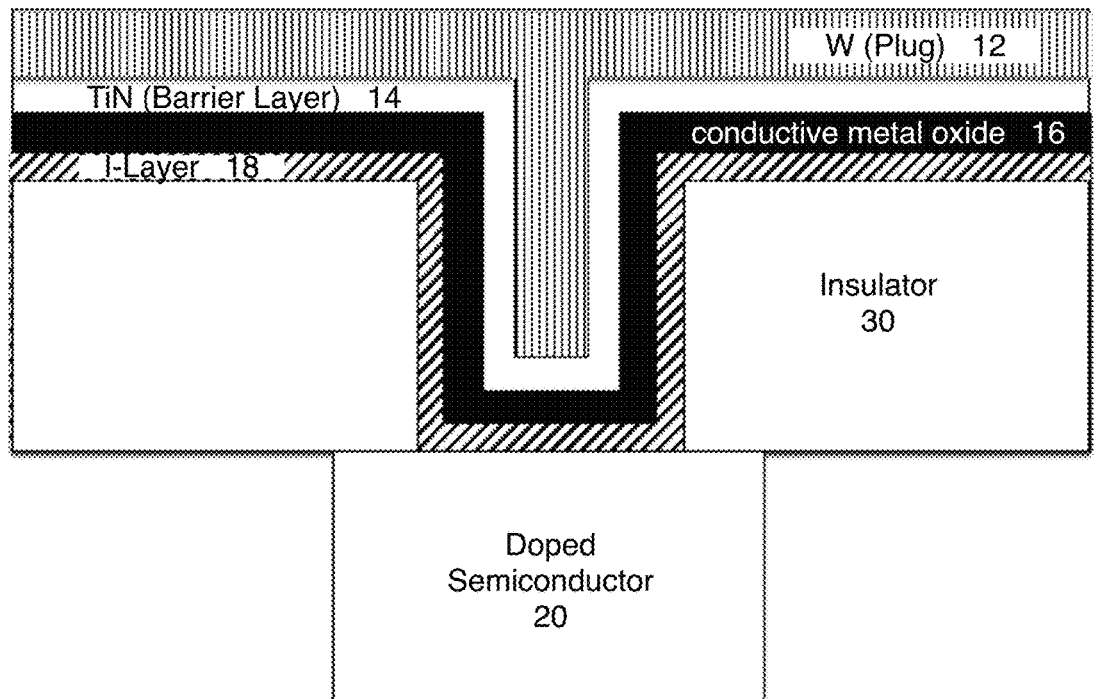
FIGS. 3A, 3B, and 3C illustrate examples of structures created during fabrication of an MIS contact structure according to an embodiment of the present invention.

As noted above, an MIS stack formed by a very thin, interfacial dielectric layer (termed herein an "I-Layer")

between a metal oxide conductor (or "M-Layer") and a semiconductor (or "S-Layer") (e.g., silicon, germanium, silicon carbide, or germanium tin) has sufficient conductivity, despite the dielectric itself having poor conductivity in its bulk state, to provide a net improvement in the conductivity (over that which would exist in the absence of the I-Layer) of the junction of which it is a constituent. To enable a favorable result with a lowering of the contact resistivity, it is necessary for the interfacial dielectric layer, which might normally be an insulating or semiconducting material in its bulk state, to be very thin—of the order of one nanometer—to enable a large current density to flow, for example by quantum mechanical tunneling.

For the specific purpose of forming improved contacts to n-type semiconducting materials, in which the current is carried by transport of electrons between the conductor and semiconductor, it may be preferred to use an interfacial dielectric layer that itself presents only a small energy barrier to electrons. An example of such a material is titanium dioxide, which is found to present only a very small barrier to electron flow between a metal and an n-type semiconductor, such as Si or Ge, of the order of zero to 0.15 electron volts. In general, with favorable band alignment, the dielectric metal-oxide thickness can be as much as 5 nm or even 10 nm.

Whilst MIS contacts with a titanium oxide interface layer have been demonstrated to be effective in reducing contact resistivity for a broad range of combinations of metals and semiconductors, a problem may arise when MIS contacts are integrated into the industrial manufacture of semiconductor devices in integrated circuits ("ICs"). Metal-semiconductor contacts are processed at what is known as the middle of line (MOL), which is the stage in integrated circuit manufacturing that occurs after transistor fabrication (front end of line, FEOL) and before the processing of metal interconnect layers (back end of line, BEOL). As a consequence the metal contacts are exposed to the processing temperatures or "thermal budget" of the processes that occur during the BEOL, including any annealing or sintering process steps that may be applied as part of the BEOL. In the current state of the art of semiconductor integrated circuit manufacturing, it is typical for the BEOL to involve exposure of the contacts to a temperature of around 400° C. over a period of approximately two hours. Such a thermal budget may cause serious degradation of the MIS contact properties, including returning the contact resistivity to a high level more consistent with a direct metal-semiconductor contact. The degradation is due most likely to a chemical reduction of the critical thin interface layer if it is an oxide (e.g., titanium oxide). Most metals have an affinity for oxygen, i.e., there is a chemical driving force to form a metal oxide when the metal is in the presence of oxygen, especially at elevated temperatures. As such, most metals when placed in contact with a metal oxide such as titanium dioxide ($TiO_2$) and heated will remove oxygen from the titanium dioxide, rapidly reducing the $TiO_2$ to a sub-stoichiometric titanium oxide and, upon continued heating thereafter, to what amounts to titanium metal with a high concentration of residual oxygen. We find experimentally, for example, that MIS contacts in which the metal is titanium, the interface layer is titanium oxide and the semiconductor is silicon rapidly degrade to titanium-silicon contacts when heated to 400° C. for as little as 30 seconds. The low Schottky barrier to n-type semiconductor and the corresponding low contact resistivity provided by the MIS structure is lost as a result of the thermal degradation of the interface layer.

We find therefore that there is a need to form an MIS contact structure of low contact resistivity that also has sufficient thermal stability to be useful in an IC manufacturing process. The present invention involves using a metal oxide as the conductive metallic layer (the M-Layer) in the MIS structure and using a different metal oxide or an oxide of a silicon or germanium as an I-Layer. The I-Layer generally comprises a material that would be an insulator or a semiconductor in its bulk state, and may include a separation layer (e.g., a further insulating layer separating the conductor and the semiconductor).

Although most metal oxides tend to be electrically insulating dielectrics, there are a number of metal oxides that exhibit electrically conductive or metallic properties. Examples of electrically conducting metal oxides (which may be suitable as conductive metal layers (M-Layers) in the present MIS structure) include but are not limited to $(Nb,Sr)TiO_3$, $(Ba,Sr)TiO_3$, $SrRuO_3$, $MoO_2$, $OsO_2$, $WO_2$, $RhO_2$, $RuO_2$, $IrO_2$, $ReO_3$, $ReO_2$, $LaCuO_3$, $Ti_2O_3$, $TiO$, $V_2O_3$, $VO$, $NbO$, $Fe_3O_4$, conducting $ZnO$, $InSnO$ and $CrO_2$. Examples of insulating metal oxides that may be used as an I-Layer in the present MIS structure include but are not limited to $TiO_2$, $MgO$, $Al_2O_3$, $HfO_2$, $ZrO_2$, $Ta_2O_5$, $V_2O_5$, $BaZrO_3$, $La_2O_3$, $Y_2O_3$, $HfSiO_4$, $ZrSiO_4$, $CoO$, $NiO$, $SrTiO_3$ or $(Ba,Sr)TiO_3$, non-conducting $ZnO$, $MnO$, silicon oxide or germanium oxide. It may be noted that some metal oxides may exhibit a metal-insulator transition as a result of a change in temperature or pressure. For example the class of metal compounds known as Mott-Hubbard insulators, including the transition metal oxides $NiO$, $Ti_2O_3$, $V_2O_3$, $Cr_2O_3$, are insulating at low temperatures and conducting at high temperatures. Considering $V_2O_3$, this material makes an insulator-metal transition at a temperature of about 145 K at atmospheric pressure and makes an insulator-metal transition at a pressure of about 7 kilobar at "room temperature", i.e., approximately 300 K. For the purposes of the present invention we are concerned with the electrical conductivity of metal oxides in the normal range of temperature and pressure experienced by MIS contacts during the normal operation of semiconductor integrated circuits—temperature typically in the range 0° C. to 125° C. and pressure close to atmospheric pressure. Non-stoichiometric variants of the metal oxides described herein, together with mixed metal oxides and mixtures of metal and silicon or germanium oxides should be understood to be within the scope of the present invention. In some cases, non-stoichiometric and also doped variants of the metal oxides exhibit semiconducting or even conducting properties, even if their undoped stoichiometric variants are considered dielectrics.

The application of a metal oxide as a conducting or metallic layer is known in the art of metal-insulator-metal (MIM) capacitor fabrication—for example, in the manufacture of dynamic random access memory (DRAM) devices—wherein a charge storage capacitor is required to have a high specific capacitance and also to have sufficient thermal stability to survive BEOL processing. For example, U.S. Pat. No. 5,619,393, incorporated herein by reference, discloses a high-dielectric-constant material layer is formed between a lower thin unreactive film on a lower electrode base, and an upper thin unreactive film with an upper electrode then formed on the upper unreactive film. In the Technical Digest of the 1994 International Electron Devices Meeting, pp. 831-834, it is disclosed that a polycrystalline $RuO_2$ thin film is deposited by a reactive sputtering method on a TiN thin film serving as a diffusion barrier layer and the laminate of the TiN thin film and the polycrystalline $RuO_2$ thin film is subsequently patterned to define a composite $RuO_2$/TiN storage electrode before a $SrTiO_3$ thin dielectric film is deposited on the $RuO_2$/TiN. The $SrTiO_3$ thin dielectric film is selected for its good chemical and thermal stability and good insulating properties and the purpose of the paraelectric $SrTiO_3$ thin dielectric film is to provide the insulating dielectric layer for a DRAM capacitor. The insulating $SrTiO_3$ thin dielectric film is not thin enough to pass a current and is not in direct contact with a semiconductor.

Generally, the instant invention uses a thin, unreactive, and conductive film to contact the thin I-Layer material in an MIS contact structure. The thin, unreactive film may be a conductive oxide such as $RuO_2$ (others include: (Nb,Sr)$TiO_3$, (Ba,Sr)$TiO_3$, $SrRuO_3$, $MoO_2$, $OsO_2$, $WO_2$, $RhO_2$, $IrO_2$, $ReO_3$, $ReO_2$, $LaCuO_3$, $Ti_2O_3$, TiO, $V_2O_3$, VO, $Fe_3O_4$, ZnO, InSnO or $CrO_2$). In addition to highly conductive tungsten(IV) oxide, also known as tungsten dioxide, $WO_2$, there are other intermediate oxides of tungsten including $W_{18}O_{49}$, $W_{20}O_{58}$, and $W_{24}O_{70}$ that may for example be formed by reacting tungsten metal and tungsten trioxide.

The thin, unreactive film is generally less than 10 nm thick, preferably less than 5 nm thick, and most preferably between 0.5 nm and 3.0 nm thick. As used herein, the term "unreactive", when used in reference to a material contacting an I-Layer material, means a material that provides a thermally stable conductive interface to the I-Layer material during and after processing (e.g., to temperatures in the range of approximately 350° C. or 450° C. in a forming gas or similar gas for on the order of approximately 2 hr.). Note that when a conductive metal oxide such as $RuO_2$ is used for the thin, unreactive, and conductive film, that layer can also contain some amount of unoxidized or partially oxidized metal, for example Ru. For example, a thin, unreactive film of $RuO_2$ which is chemically changed by becoming partially reduced during the deposition process of the complete metal stack and ensuing thermal cycles is still considered unreactive since it still provides a stable conductive interface to the I-Layer material. The I-Layer may be on the order of 0.2 nm-10 nm, or more preferably 0.2 nm-5 nm, or still more preferably, 0.2 nm-1.0 nm.

When the instant invention is applied to the fabrication of MIS contacts in integrated circuits, it is understood that several different metal layers constitute an interconnect system that is key to the operation of the integrated circuit. Typically, multiple highly conductive metal interconnect layers, often as many as ten or more, are used to form the complex interconnections between devices and these layers are most commonly copper surrounded (clad) by a barrier metal such as tantalum nitride (TaN). The multiple TaN-clad copper layers are separated by inter-layer dielectric (ILD) layers, with the ILD material being a reliable insulator such as silicon dioxide. The connection between the lowest copper interconnect layer and the MIS contact is typically by way of a tungsten plug formed in a contact via. To provide good adhesion of the W plug to the via, the via is typically first lined with a deposited thin layer of "adhesion" and/or "barrier" metal before the W is deposited. The adhesion or barrier metal is typically titanium nitride (TiN) or a Ti/TiN thin laminate. Referring to FIG. 1, the structure of an MIS contact 10 according to an embodiment of the instant invention thus includes, in sequence, a W plug 12 and a TiN barrier/adhesion layer 14, an unreactive, conductive metal oxide 16 (such as $RuO_2$), and an I-Layer 18 (such as $TiO_2$, $TiSixO_y$, or $TiO_2/SiO_2$), with the I-Layer 18 being in contact with the semiconductor 20. The semiconductor 20 is typically silicon, germanium, silicon germanium alloy, germanium tin alloy, or silicon germanium tin alloy but may also be a compound semiconductor such as SiC, GaN, InGaN, GaAs, InAs, InGaAs alloy, GaSb or InSb, terniary or quarterniary compound semiconductors, or a two-dimensional semiconductor such as graphene, silicene, germanene, phosphorene, monolayer molybdenum disulfide, or carbon nanotubes.

With reference to FIG. 2, the component parts of an MIS structure 22 according to an embodiment of the instant invention may therefore be described as follows: The M-Layer 24 is a stack of metals such as Cu/TaN/W/TiN/RuO2. The I-Layer 26 comprises one or more oxides, an oxide of titanium $TiO_x$ and/or an oxide of silicon $SiO_x$ (such as $TiO_2$ or $TiSi_xO_y$, or $TiO_2/SiO_2$), that would be considered insulator(s) or semiconductor(s) in bulk form but are conductive when made extremely thin. The S-Layer 28 is a semiconductor such as silicon or germanium or silicon germanium alloy. An innovative aspect of the invention is that the metal at the bottom of the metal stack i.e., the metal that is adjacent to and in direct contact with the I-Layer is a metal oxide that is electrically conductive, chemically stable, and unreactive at its interface with the I-Layer at temperatures up to 450° C. The disclosed MIS structure also has the property that the contact resistivity for the contact structure is lower than approximately $10^{-5}$-$10^{-7}$ $\Omega \cdot cm^2$, and preferably lower than approximately $10^{-8}$ $\Omega \cdot cm^2$.

Figure 3B:
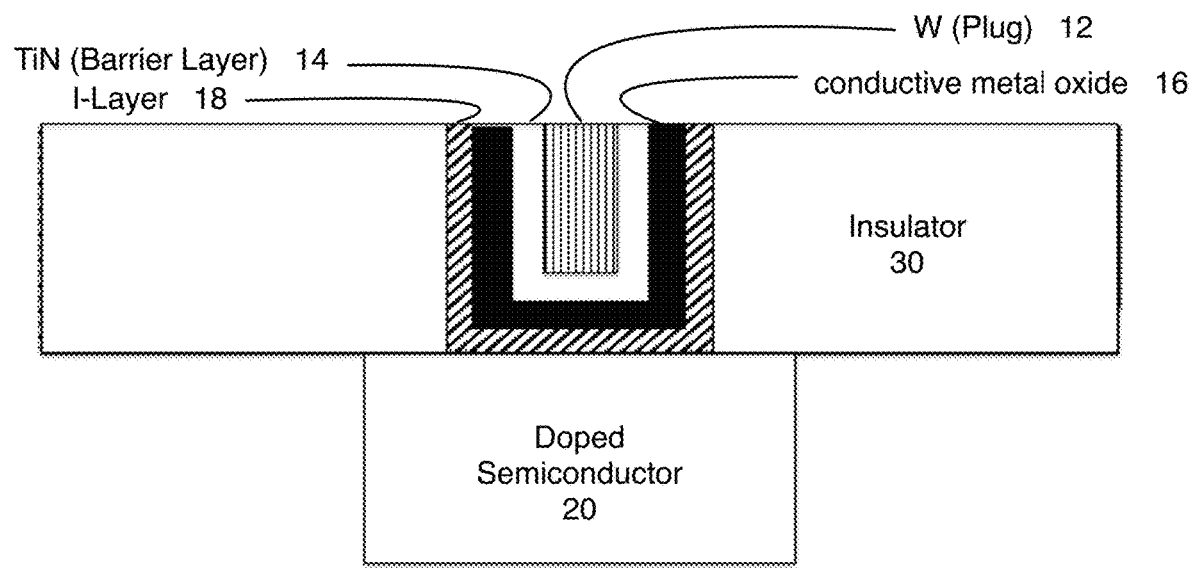

In one embodiment of the invention, illustrated in FIG. 3A, after forming a highly n-type doped region of semiconductor 20, which may for example be a source or drain region of a field effect transistor, the region is covered by a deposited layer of insulating material 30, which may be an oxide of silicon. Subsequently, a contact window, or via, is defined (e.g., by photolithographic or other means) and a hole is etched through the insulating layer to expose a surface of the n-type doped semiconductor region. The exposed surface of the n-type doped semiconductor region is cleaned, for example by a short exposure to hydrofluoric acid diluted in water, and then a first layer of a metal oxide (I-Layer, 18) is formed on the exposed surface. Thereafter a different metal oxide layer 16 that is electrically conductive is deposited over the first metal oxide layer 18. Subsequently, a layer of an adhesion or barrier metal 14 is deposited and the contact hole is then filled with a different bulk metal to form a metal plug 12. If any of the processes used to form the conductive material layers is not selective, those conductive material layers will be deposited on all surfaces including on top of the insulating material 30 as well as within the contact hole as illustrated in FIG. 3A. In such a case, those conductive material layers that are not deposited selectively within the contact hole are subsequently removed from atop the insulating layer, for example by chemical-mechanical polishing (CMP), leaving the conductive materials substantially filling the contact hole to form an MIS contact contained within the contact hole, as shown in FIG. 3B. Subsequently, multiple layers of metal interconnect separated by insulating material may be deposited and patterned and the whole assembly may be annealed at temperatures in excess of 300° C., and even at 400° C. or higher, to improve the functional properties or the reliability of the integrated circuit. Annealing may be in an atmosphere of hydrogen and nitrogen gas (so-called forming gas) or inert gas, and accumulated annealing time may be tens of minutes and as much as two hours.

Figure 3C:
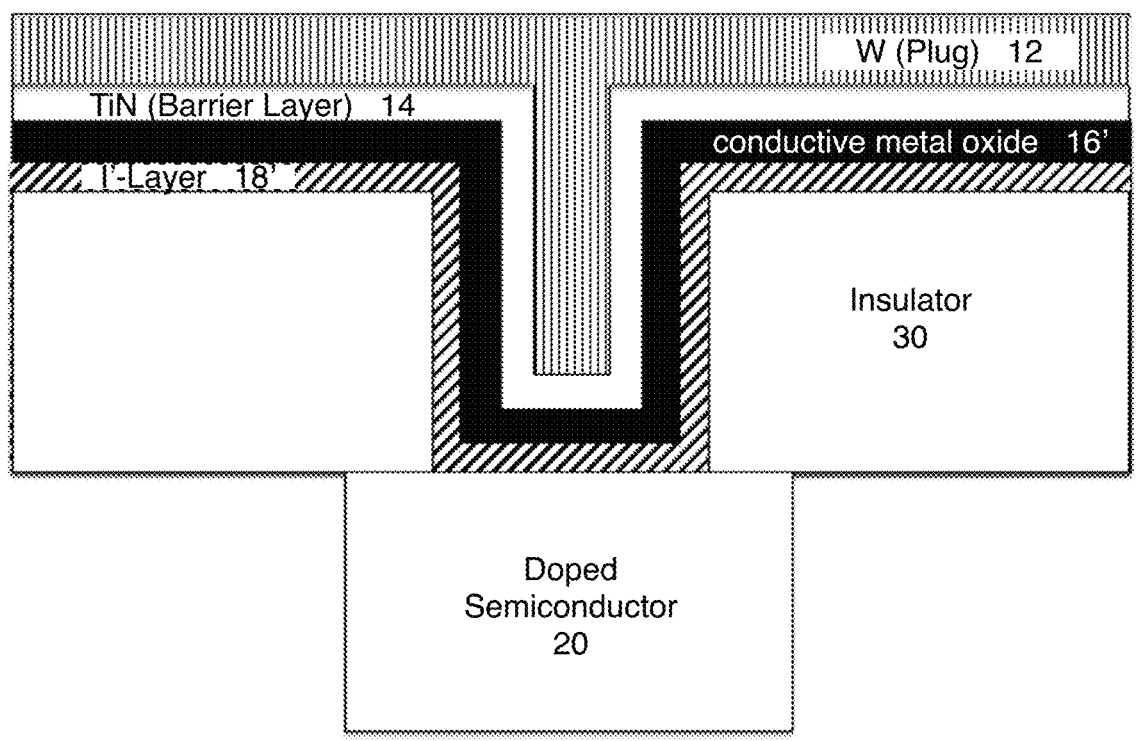

In another embodiment of the invention, illustrated in FIG. 3C, after forming a highly n-type doped region of semiconductor 20, which may for example be a source or drain region of a field effect transistor, the region is covered by a deposited layer of insulating material 30, which may be an oxide of silicon. Subsequently, a contact window, or via, is defined (e.g., by photolithographic or other means) and a hole or trench is etched through the insulating layer to expose a surface of the n-type doped semiconductor region. The exposed surface of the n-type doped semiconductor region is cleaned, for example by a short exposure to hydrofluoric acid diluted in water, and then a first layer of a metal oxide (I'-Layer, 18') is formed on the exposed surface. Thereafter a different metal oxide layer 16' that is electrically conductive is deposited over the first metal oxide layer 18'. A layer of tungsten 14 is deposited by metalorganic chemical vapor deposition or atomic layer deposition and the contact hole is then filled with tungsten to form a tungsten plug 12. If any of the processes used to form the conductive material layers is not selective, those conductive material layers will be deposited on all surfaces including on top of the insulating material 30 as well as within the contact hole as illustrated in FIG. 3A. In such a case, those conductive material layers that are not deposited selectively within the contact hole are subsequently removed from atop the insulating layer, for example by chemical-mechanical polishing (CMP), leaving the conductive materials substantially filling the contact hole to form an MIS contact contained within the contact hole, as shown in FIG. 3B. Subsequently, multiple layers of metal interconnect separated by insulating material may be deposited and patterned and the whole assembly may be annealed at temperatures in excess of 300° C., and even at 400° C. or higher, to improve the functional properties or the reliability of the integrated circuit. Annealing may be in an atmosphere of hydrogen and nitrogen gas (so-called forming gas) or inert gas, and accumulated annealing time may be tens of minutes and as much as two hours.

In alternative embodiments, the process of forming the contact hole may expose more than one n-type doped region of semiconductor. The same process may expose at least one region of p-type doped semiconductor in addition to the at least one n-type doped region of semiconductor. The n-type doped region(s) of semiconductor may be silicon regions or silicon-carbon alloy regions or silicon-phosphorus alloy regions or other semiconductor regions. The p-type doped region(s) of semiconductor may be silicon regions or silicon-germanium alloy regions or germanium regions or other semiconductor regions.

In one embodiment of the invention, the n-type doped region of semiconductor is a silicon (Si) source or drain region of a field effect transistor, where the silicon is very heavily doped with phosphorus (P) to a concentration in excess of $10^{20}$ cm$^{-3}$ (which may be denoted as a silicon-phosphorus alloy, Si:P) the first metal oxide layer is titanium dioxide (TiO$_2$) and it is deposited by atomic layer deposition (ALD) to a thickness of between 0.2 nm and 3.0 nm, and the second metal oxide layer is conductive ruthenium oxide (RuO$_2$) deposited by ALD to a thickness of between 1.0 nm and 5.0 nm. The adhesion or barrier metal is titanium nitride (TiN), deposited by ALD to a thickness of between 1.0 nm and 5.0 nm, and the bulk metal that forms a metal plug is tungsten (W), deposited by chemical vapor deposition (CVD).

In another embodiment of the invention, the n-type doped region of semiconductor is a silicon (Si) source or drain region of a field effect transistor, where the silicon is very heavily doped with phosphorus (P), for example to a concentration in excess of $10^{20}$ cm$^{-3}$ (which may be denoted as a silicon-phosphorus alloy, Si:P) the first metal oxide layer (I-layer) is tungsten trioxide (WO$_3$) with a thickness of between 0.2 nm and 3.0 nm, and the second metal oxide layer (M-layer) is conductive tungsten oxide (e.g., WO$_2$ or a conductive tungsten oxide with stoichiometry between WO$_2$ and WO$_3$ such as W$_{18}$O$_{49}$) with a thickness of between 0.5 nm and 5.0 nm. The adhesion or barrier metal is tungsten (W), deposited by metalorganic chemical vapor deposition or atomic layer deposition to a thickness of between 0.5 nm and 5.0 nm, and the bulk metal that forms a metal plug is also tungsten (W), deposited by chemical vapor deposition (CVD) or physical vapor deposition (PVD). The first metal oxide (WO$_3$) is deposited by atomic layer deposition (ALD) or is formed by deposition of a thin layer of tungsten metal that is subsequently oxidized. The conductive tungsten oxide (e.g. W$_{18}$O$_{49}$ or WO$_2$) is deposited by ALD or CVD or is formed by reaction of tungsten metal with the WO$_3$ I-layer to form a conductive tungsten oxide layer on top of some remaining thickness of the WO$_3$ I-layer. The conductive tungsten oxide may have a composition intermediate between WO$_2$ and WO$_3$ (including one or a mixture of WO$_2$, W$_{18}$O$_{49}$, W$_{20}$O$_{58}$, W$_{24}$O$_{70}$) and the composition may vary in this range through the depth of the conductive tungsten oxide layer. Reaction of W with WO$_3$ forms a sub-stoichiometric tungsten oxide layer of composition ranging between WO$_2$ and WO$_3$ (including one or a mixture of WO$_2$, W$_{18}$O$_{49}$, W$_{20}$O$_{58}$, W$_{24}$O$_{70}$). Furthermore, one or a few atomic monolayers of silicon oxide may exist at the silicon interface between the WO$_3$ and the silicon. The metal that forms a metal plug may alternately be a low resistance metal, for example copper or silver.

In another embodiment of the invention, the n-type doped region of semiconductor is a silicon (Si) source or drain region of a field effect transistor, where the silicon is very heavily doped with a donor such as phosphorus (P), for example to a concentration in excess of $10^{20}$ cm$^{-3}$, the first metal oxide layer (I-layer) is V$_2$O$_5$ with a thickness of between 0.2 nm and 3.0 nm, and the second metal oxide layer (M-layer) is conductive vanadium oxide (e.g., V$_2$O$_3$) with a thickness of between 0.5 nm and 5.0 nm. The adhesion or barrier metal layer comprises tungsten (W) or vanadium (V) or a mixture of W and V, deposited by metalorganic chemical vapor deposition or atomic layer deposition to a thickness of between 0.5 nm and 5.0 nm. The first metal oxide (V$_2$O$_5$) is deposited by atomic layer deposition (ALD) or is formed by deposition of a thin layer of vanadium metal that is subsequently oxidized. The conductive vanadium oxide (e.g. V$_2$O$_3$) is deposited by ALD or CVD or is formed by reaction of vanadium metal with the V$_2$O$_5$ I-layer. The conductive vanadium oxide may have a composition intermediate between VO and VO$_2$ and the composition may vary in this range through the depth of the conductive vanadium oxide layer. Reaction of V from the adhesion or barrier metal layer with V$_2$O$_5$ forms a vanadium oxide layer of composition ranging between VO and VO$_2$ on top of some remaining thickness of the V$_2$O$_5$ I-layer. Furthermore, one or a few atomic monolayers of silicon oxide may exist at the silicon interface between the V$_2$O$_5$ and the silicon. The metal that forms a metal plug may alternately be a low resistance metal, for example copper or silver.

In another embodiment of the invention, the n-type doped region of semiconductor is a silicon (Si) source or drain region of a field effect transistor, where the silicon is very heavily doped with a donor such as phosphorus (P), for example to a concentration in excess of $10^{20}$ cm$^{-3}$, the first metal oxide layer (I-layer) is TiO$_2$ with a thickness of between 0.2 nm and 3.0 nm, and the second metal oxide layer (M-layer) is conductive tungsten oxide (e.g., WO$_2$) with a thickness of between 0.5 nm and 5.0 nm. The adhesion or barrier metal layer comprises tungsten (W), deposited by metalorganic chemical vapor deposition or atomic layer deposition to a thickness of between 0.5 nm and 5.0 nm. The first metal oxide ($TiO_2$) is deposited by atomic layer deposition (ALD) or is formed by deposition of a thin layer of titanium metal that is subsequently oxidized. The conductive tungsten oxide (e.g. $WO_2$) is deposited by ALD or CVD or is formed by reaction of tungsten metal from the adhesion or barrier metal layer with the $TiO_2$ I-layer. The conductive tungsten oxide may have a composition intermediate between $WO_2$ and $WO_{2.95}$ and the composition may vary in this range through the depth of the conductive tungsten oxide layer. Reaction of W from the adhesion or barrier metal layer with $TiO_2$ forms a conductive mixed oxide layer comprising a mixture of tungsten and titanium oxides on top of some remaining thickness of the $TiO_2$ I-layer. Furthermore, one or a few atomic monolayers of silicon oxide may exist at the silicon interface between the $TiO_2$ and the silicon.

In other embodiments of the invention, the first metal oxide layer (I-Layer) may comprise any one of or a combination of $WO_3$, $TiO_2$, MgO, $Al_2O_3$, $HfO_2$, $ZrO_2$, $Ta_2O_5$, $V_2O_5$, $BaZrO_3$, $La_2O_3$, $Y_2O_3$, $HfSiO_4$, $ZrSiO_4$, CoO, NiO, GaO, $SrTiO_3$ or $(Ba,Sr)TiO_3$, silicon oxide or germanium oxide or doped or non-stochiometric insulating variants thereof. Moreover the first metal oxide may alternatively be deposited by atomic layer deposition (ALD), plasma-enhanced ALD, chemical vapor deposition (CVD), plasma-enhanced CVD, atomic vapor deposition, oxidation of a deposited thin film of the metal, laser ablation, physical vapor deposition, or by reaction of a metal with a thin layer of an oxide of the n-type doped region of semiconductor. The first metal oxide may be a mixed oxide, comprising the oxides of two different metals (such as hafnium zirconium oxide, $Hf_xZr_{1-x}O_2$) or comprising the oxides of a metal and a semiconductor such as silicon or germanium, such as titanium silicate, $TiSi_xO_y$, or a mixed metal/semiconductor oxide with some amount of nitrogen (i.e. a metal silicon oxynitride such as titanium silicon oxynitride).

In still further embodiments of the invention, the second metal oxide that is electrically conductive (M-layer) may comprise any one of or a combination of $SrRuO_3$, a conductive oxide of tungsten (e.g., $WO_2$, $W_2O_5$, or a mixture of tungsten oxides with compositions ranging between $WO_2$ and $WO_{2.95}$ including one or a mixture of $WO_2$, $W_{18}O_{49}$, $W_{20}O_{58}$, $W_{24}O_{70}$, $W_{25}O_{73}$, $W_{40}O_{118}$), $LaCuO_3$, $Fe_3O_4$, $LaSrCoO_3$, conducting ZnO, and $CrO_2$, or an oxide of ruthenium (RuOx) or iridium (IrOx), a dioxide of ruthenium ($RuO_2$), rhodium ($RhO_2$), palladium, osmium ($OsO_2$), or iridium ($IrO_2$), or a conductive oxide of rhenium ($ReO_2$ or $ReO_3$), titanium ($Ti_2O_3$ or TiO) or vanadium ($V_2O_3$ or VO) or indium tin oxide (ITO) or aluminum-doped zinc-oxide (AZO) or doped or non-stochiometric conducting variants thereof. The second metal oxide may alternatively be deposited by reactive sputtering (of the metal in a plasma comprising oxygen), ALD, CVD, laser ablation, cyclic voltametric deposition, anodic deposition, electrophoretic deposition, oxidation of a thin film of the metal, or any of the other means discussed above.

As noted above, although examples of metal oxides that may comprise the interface layer are specified herein, persons of ordinary skill in the art will appreciate that such metal oxides may not have the precise stoichiometry of the examples. For instance, TiO2 may more preferably be described as TiOx, with x less than or equal to 2 but greater than 1.5. Similar stoichiometries of others of the metal oxides described herein should be understood to be within the scope of the present invention. Furthermore persons of ordinary skill in the art will appreciate that such metal oxides may include some amount of nitrogen, the amount of nitrogen being less than the amount of oxygen.

In other embodiments the adhesion or barrier metal may be tantalum nitride or ruthenium oxide or tungsten or CoWP. The adhesion or barrier metal may be deposited by atomic layer deposition or chemical vapor deposition (CVD) or metal organic chemical vapor deposition (MOCVD) or physical vapor deposition (PVD). The bulk metal that forms a metal plug may be cobalt or copper or aluminum or silver or a plurality of carbon nanotubes. The metal that forms a metal plug may alternatively be deposited by CVD, PVD, sputtering or electrochemical deposition.

A similar process may be applied to form MIS contacts to p-type doped regions of semiconductor material.

In various embodiments, the layers described herein may be deposited in a single process chamber (in sequential processing steps), in different chambers of a multi-chamber processing tool, or in separate processing tools.

Thus, described herein is an electrical contact structure including a conductor; a semiconductor (e.g., a III-V compound semiconductors or a semiconductor comprising one or several of the group IV elements silicon, germanium, carbon, or tin); and an interfacial dielectric layer of less than 4 nm thickness disposed between and in contact with both the conductor and the semiconductor, wherein the conductor is a conductive metal oxide, and wherein the interfacial dielectric layer is an oxide of a metal or an oxide of a semiconductor or an oxide of multiple different metals or metal(s) and semiconductor(s). In various embodiments, the electrical contact structure has a specific contact resistivity of less than or equal to approximately $10^{-5}$-$10^{-7}$ $\Omega$-$cm^2$ when the doping in the semiconductor adjacent the MIS contact is greater than approximately $2\times10^{19}$ $cm^{-3}$ and less than approximately $1\times10^{-8}$ $\Omega$-$cm^2$ when the doping in the semiconductor adjacent the MIS contact is greater than approximately $10^{20}$ $cm^{-3}$. Alternatively, or in addition, the interface layer is a material that would be an insulator or a wide band gap semiconductor in its bulk state. In some embodiments, the interfacial dielectric layer has a thickness in the range 0.2 nm to 10 nm, preferably 0.2 nm to 4 nm, and may be one of: $WO_3$, $TiO_2$, MgO, $Al_2O_3$, $HfO_2$, $ZrO_2$, $Ta_2O_5$, $V_2O_5$, $BaZrO_3$, $La_2O_3$, $Y_2O_3$, $HfSiO_4$, $ZrSiO_4$, CoO, NiO, GaO, $SrTiO_3$ or $(Ba,Sr)TiO_3$, silicon oxide or germanium oxide. The conductive metal oxide layer may have a thickness in the range 0.5 nm to 3 nm (although in other embodiments different thicknesses may be used) and may be one of: $WO_2$ (or a mixture of tungsten oxides with compositions ranging between $WO_2$ and $WO_{2.95}$ including one or a mixture of $WO_2$, $W_{18}O_{49}$, $W_{20}O_{58}$, $W_{24}O_{70}$, $W_{25}O_{73}$, $W_{40}O_{118}$), $(Nb,Sr)TiO_3$, $(Ba,Sr)TiO_3$, $SrRuO_3$, $MoO_2$, $OsO_2$, $WO_2$, $RhO_2$, $RuO_2$, $IrO_2$, $ReO_3$, $ReO_2$, $LaCuO_3$, $Ti_2O_3$, TiO, $V_2O_3$, VO, $Fe_3O_4$, zinc oxide (ZnO), indium tin oxide (ITO), aluminum-doped zinc-oxide (AZO), InSnO or $CrO_2$. In some embodiments, the interfacial dielectric layer includes a separation layer (e.g., a further insulating oxide layer separating the conductor and the semiconductor). Preferably, the junction between the conductive metal oxide layer and the interfacial dielectric layer is chemically stable up to a temperature of 400° C. and more preferably chemically stable up to a temperature of 450° C. For example, there is preferably no chemical reaction between the conductive metal oxide layer and the interfacial dielectric layer that substantially consumes the interfacial dielectric up to a temperature of 450° C. Also, or alternatively, the contact resistivity of the device is preferably less than or equal to approximately $10^{-7}$ $\Omega$-$cm^2$ after the device is heated to a temperature of 400° C. More preferably, the contact resistivity of the device remains less than or equal to approximately $10^{-7}$ Ω-cm$^2$ after the device is heated to a temperature of 450° C. In some embodiments, the conductive metal oxide layer of the electrical contact structure is contacted by a thin metal layer of a different metal.

What is claimed is:

1. A metal-insulator-semiconductor electrical contact, comprising a conductor including one of: WO$_2$, (Nb,Sr)TiO$_3$, (Ba,Sr)TiO$_3$, SrRuO$_3$, MoO$_2$, OsO$_2$, RhO$_2$, RuO$_2$, IrO$_2$, ReO$_3$, ReO$_2$, LaCuO$_3$, Ti$_2$O$_3$, TiO, V$_2$O$_3$, VO, Fe$_3$O$_4$, ZnO, indium tin oxide (ITO), aluminum-doped zinc-oxide (AZO), InSnO, and CrO$_2$, or any of their doped or non-stochiometric variants; a semiconductor layer; and an interfacial dielectric layer of 0.2 nm to 10 nm thickness disposed between and in contact with both the conductor and the semiconductor layer, the interfacial dielectric layer comprising a plurality of oxide layers including at least one of (i) a metal oxide including one of: WO$_3$, TiO$_2$, MgO, Al$_2$O$_3$, HfO$_2$, ZrO$_2$, Ta$_2$O$_5$, V$_2$O$_5$, BaZrO$_3$, La$_2$O$_3$, Y$_2$O$_3$, HfSiO$_4$, ZrSiO$_4$, CoO, NiO, GaO, SrTiO$_3$, (Ba,Sr)TiO$_3$, and ZnO, (ii) an oxide of silicon, or (iii) an oxide of germanium.

2. A method of manufacturing a metal-insulator-semiconductor electrical contact, comprising:
   forming an n-type doped region of a semiconductor layer,
   depositing a layer of an insulating material over the n-type doped region of the semiconductor layer;
   defining a contact window and etching a hole through the layer of the insulating material to expose a surface of the n-type doped region of the semiconductor layer;
   cleaning the exposed surface of the n-type doped region of the semiconductor layer;
   forming a first layer of a first metal oxide on the exposed surface of the n-type doped region of the semiconductor layer;
   depositing a second layer of a second metal oxide different than the first metal oxide and that is electrically conductive over the first layer of the first metal oxide;
   depositing a layer of an adhesion or barrier metal and filling the hole with a bulk metal to form a metal plug.

3. A method of manufacturing a metal-insulator-semiconductor electrical contact, comprising:
   forming an n-type doped region of a semiconductor layer,
   depositing a layer of an insulating material over the n-type doped region of the semiconductor layer;
   defining a contact window and etching a hole through the layer of insulating material to expose a surface of the n-type doped region of the semiconductor layer;
   cleaning the exposed surface of the n-type doped region of the semiconductor layer;
   forming a first layer of a first metal oxide on the exposed surface of the n-type doped semiconductor region of the semiconductor layer;
   depositing a second layer of a second metal oxide different than the first metal oxide and that is electrically conductive over the first layer of the first metal oxide;
   depositing a layer of tungsten and filling the hole with tungsten to form a tungsten plug.

4. The method of claim 2 wherein the first layer of the first metal oxide is one of: TiO$_2$, MgO, Al$_2$O$_3$, HfO$_2$, ZrO$_2$, Ta$_2$O$_5$, V$_2$O$_5$, BaZrO$_3$, La$_2$O$_3$, Y$_2$O$_3$, HfSiO$_4$, ZrSiO$_4$, CoO, NiO, SrTiO$_3$ or (Ba,Sr)TiO$_3$, non-conducting ZnO, MnO, or any of their non-stochiometric variants.

5. The method of claim 2 wherein the second layer of the second metal oxide is one of: WO$_2$, (Nb,Sr)TiO$_3$, (Ba,Sr)TiO$_3$, SrRuO$_3$, MoO$_2$, OsO$_2$, RhO$_2$, RuO$_2$, IrO$_2$, ReO$_3$, ReO$_2$, LaCuO$_3$, Ti$_2$O$_3$, TiO, V$_2$O$_3$, VO, Fe$_3$O$_4$, ZnO, indium tin oxide (ITO), aluminum-doped zinc-oxide (AZO), InSnO, CrO$_2$, or any of their non-stochiometric variants.

6. The method of claim 3 wherein the first layer of the first metal oxide is one of: TiO$_2$, MgO, Al$_2$O$_3$, HfO$_2$, ZrO$_2$, Ta$_2$O$_5$, V$_2$O$_5$, BaZrO$_3$, La$_2$O$_3$, Y$_2$O$_3$, HfSiO$_4$, ZrSiO$_4$, CoO, NiO, SrTiO$_3$ or (Ba,Sr)TiO$_3$, non-conducting ZnO, MnO, or any of their non-stochiometric variants.

7. The method of claim 3 wherein the second layer of the second metal oxide is one of: WO$_2$, (Nb,Sr)TiO$_3$, (Ba,Sr)TiO$_3$, SrRuO$_3$, MoO$_2$, OsO$_2$, RhO$_2$, RuO$_2$, IrO$_2$, ReO$_3$, ReO$_2$, LaCuO$_3$, Ti$_2$O$_3$, TiO, V$_2$O$_3$, VO, Fe$_3$O$_4$, ZnO, indium tin oxide (ITO), aluminum-doped zinc-oxide (AZO), InSnO, CrO$_2$, or any of their non-stochiometric variants.

8. The method of claim 2, wherein the second layer of the second metal oxide is between 0.5 nm and 3.0 nm thick.

9. The method of claim 3, wherein the second layer of the second metal oxide is between 0.5 nm and 3.0 nm thick.

10. The method of claim 2, wherein the first layer of the first metal oxide is 0.2 nm-10 nm thick.

11. The method of claim 2, wherein the first layer of the first metal oxide is 0.2 nm-5 nm thick.

12. The method of claim 2, wherein the first layer of the first metal oxide is 0.2 nm-1.0 nm thick.

13. The method of claim 3, wherein the first layer of the first metal oxide is 0.2 nm-10 nm thick.

14. The method of claim 3, wherein the first layer of the first metal oxide is 0.2 nm-5 nm thick.

15. The method of claim 3, wherein the first layer of the first metal oxide is 0.2 nm-1.0 nm thick.

16. The method of claim 2, wherein the bulk metal is tungsten.

17. The method of claim 2, wherein the semiconductor layer is one of: Si; Ge; an alloy of Si and Ge; an alloy of Ge and Sn; an alloy of Ge, Sn, and Si; SiC; GaN; InGaN; GaAs; InAs; InGaAs alloy; GaSb; InSb; terniary or quarterniary compound semiconductors, graphene, silicene, germanene, phosphorene, monolayer molybdenum disulfide, or carbon nanotubes.

18. The method of claim 3, wherein the semiconductor layer is one of: Si; Ge; an alloy of Si and Ge; an alloy of Ge and Sn; an alloy of Ge, Sn, and Si; SiC; GaN; InGaN; GaAs; InAs; InGaAs alloy; GaSb; InSb; terniary or quarterniary compound semiconductors, graphene, silicene, germanene, phosphorene, monolayer molybdenum disulfide, or carbon nanotubes.

* * * * *